US012751287B2

(12) United States Patent
Shikata

(10) Patent No.: US 12,751,287 B2
(45) Date of Patent: Sep. 29, 2026

(54) NITRIDE SEMICONDUCTOR DEVICE WITH EMBEDDED METAL IN TRENCH OF SUBSTRATE

(71) Applicant: ROHM CO., LTD., Kyoto (JP)

(72) Inventor: Keita Shikata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 448 days.

(21) Appl. No.: 18/471,333

(22) Filed: Sep. 21, 2023

(65) Prior Publication Data

US 2024/0014094 A1 Jan. 11, 2024

Related U.S. Application Data

(63) Continuation of application No. PCT/JP2022/003094, filed on Jan. 27, 2022.

(30) Foreign Application Priority Data

Mar. 26, 2021 (JP) ................................ 2021-053735

(51) Int. Cl.
*H10W 40/22* (2026.01)
*H10D 30/01* (2025.01)
(Continued)

(52) U.S. Cl.
CPC ........ *H10W 40/226* (2026.01); *H10D 30/015* (2025.01); *H10D 30/475* (2025.01);
(Continued)

(58) Field of Classification Search
CPC ............. H01L 23/3672; H01L 23/3736; H01L 23/481; H10D 30/015; H10D 30/475;
(Continued)

(56) References Cited

U.S. PATENT DOCUMENTS 9,991,373 B1 * 6/2018 Birner .................. H10D 30/475
12,324,180 B2 * 6/2025 Wu ................... H01L 23/49562
(Continued)

FOREIGN PATENT DOCUMENTS

CN 105140122 A 12/2015
DE 102013211374 A1 12/2014
(Continued)

OTHER PUBLICATIONS

"Chip-level thermal management in GAN HEMT: Critical Review on recent patents and Inventions." Microelectronic Engineering, vol. 273, Mar. 2023, p. 111958, https://doi.org/10.1016/j.mee.2023.111958. (Year: 2023).*

(Continued)

*Primary Examiner* — J.E. Schoenholtz
(74) *Attorney, Agent, or Firm* — XSENSUS LLP

(57) ABSTRACT

A nitride semiconductor device is a nitride semiconductor device including a substrate that has a first main surface and a second main surface at an opposite side thereto and a nitride epitaxial layer that is formed on the first main surface. The nitride semiconductor device has, in plan view, an active region inside the nitride epitaxial layer in which a two-dimensional electron gas can form and an inactive region inside the nitride epitaxial layer in which the two-dimensional electron gas is not formed and includes trenches that, in at least the inactive region among the active region and the inactive region, are formed in the substrate and are dug in from the second main surface toward the first main surface and embedded metals that are formed inside the trenches.

20 Claims, 33 Drawing Sheets

(51) Int. Cl.

| | |
|---|---|
| ***H10D 30/47*** | (2025.01) |
| ***H10D 62/85*** | (2025.01) |
| ***H10D 64/23*** | (2025.01) |
| ***H10W 40/25*** | (2026.01) |

(52) U.S. Cl.
CPC ....... *H10D 62/8503* (2025.01); *H10D 64/258* (2025.01); *H10W 40/258* (2026.01)

(58) Field of Classification Search
CPC ............. H10D 62/8503; H10D 64/258; H10D 62/357; H10D 64/256; H10D 62/117; H10W 40/226; H10W 40/258; H10W 20/20
See application file for complete search history.

(56) References Cited

U.S. PATENT DOCUMENTS

| | | | | |
|---|---|---|---|---|
| 2008/0210977 | A1* | 9/2008 | Okita | H10D 30/4755 257/E29.189 |
| 2018/0158941 | A1* | 6/2018 | Birner | H10D 30/475 |
| 2019/0296140 | A1* | 9/2019 | Yoshimochi | H10D 30/475 |
| 2020/0176400 | A1* | 6/2020 | Chikamatsu | H01L 23/645 |
| 2021/0226040 | A1* | 7/2021 | Yeh | H01L 21/02581 |
| 2023/0282710 | A1* | 9/2023 | Buckley | H10D 30/475 257/194 |

FOREIGN PATENT DOCUMENTS

| | | | |
|---|---|---|---|
| JP | 2004-363563 | A | 12/2004 |
| JP | 2013-197357 | A | 9/2013 |
| JP | 2016-163017 | A | 9/2016 |
| JP | 2017-228621 | A | 12/2017 |
| JP | 2019-169551 | A | 10/2019 |

OTHER PUBLICATIONS

Zhong, Yaozong, et al. "A review on the gan-on-si power electronic devices." Fundamental Research, vol. 2, No. 3, May 2022, pp. 462-475, https://doi.org/10.1016/j.fmre.2021.11.028. (Year: 2022).*

Office Action dated Jan. 28, 2025 in corresponding German patent application No. 112022001240.4 (10 pages; with English translation).

Notice of Reasons for Refusal dated Aug. 28, 2025 in corresponding Japanese patent application No. 2023-508713 (7 pages; with English translation).

International Search Report and Written Opinion mailed on Apr. 26, 2022, received for PCT Application PCT/JP2022/003094, filed on Jan. 27, 2022, 14 pages including English Translation.

Office Action dated Apr. 2, 2026 in corresponding German patent application No. 112022001240.4 (6 pages; with English translation).

* cited by examiner

NITRIDE SEMICONDUCTOR DEVICE WITH EMBEDDED METAL IN TRENCH OF SUBSTRATE

CROSS-REFERENCE TO RELATED APPLICATIONS

This application is a continuation of International Application No. PCT/JP2022/003094, filed Jan. 27, 2022, which claims priority to JP 2021-053735, filed Mar. 26, 2021, the entire contents of each are incorporated herein by reference.

TECHNICAL FIELD

The present disclosure relates to a nitride semiconductor device that is constituted of a group III nitride semiconductor (hereinafter referred to at times simply as "nitride semiconductor").

BACKGROUND ART

A group III nitride semiconductor is a semiconductor among group III-V semiconductors with which nitrogen is used as the group V element. Aluminum nitride (AlN), gallium nitride (GaN), and indium nitride (InN) are representative examples thereof. It can generally be expressed as $Al_xIn_yGa_{1-x-y}N$ ($0 \leq x1$, $0 \leq y \leq 1$, $0 \leq x+y \leq 1$).

An HEMT (high electron mobility transistor) using a nitride semiconductor is disclosed in Patent Literature 1. The HEMT of Patent Literature 1 includes a p-type Si substrate, a buffer layer formed on the p-type Si substrate, an electron transit layer constituted of GaN and formed on the buffer layer, and an electron supply layer constituted of AlGaN and formed on the electron transit layer. A drain electrode and a gate electrode are formed such as to contact the electron supply layer.

Also, a source electrode is formed such as to penetrate through the electron supply layer, the electron transit layer, and the buffer layer and contact the p-type Si substrate. A rear surface electrode that is electrically connected to the source electrode via the p-type Si substrate is formed on a rear surface of the p-type Si substrate.

Due to polarization caused by lattice mismatch of GaN and AlGaN, a two-dimensional electron gas is formed at a position inside the electron transit layer that is only a few A inward from an interface between the electron transit layer and the electron supply layer. A source and a drain are connected to each other with the two-dimensional electron gas as a channel. When the two-dimensional electron gas is interrupted by application of a control voltage to the gate electrode, the source and the drain are interrupted from each other.

CITATION LIST

Patent Literature

Patent Literature 1: Japanese Patent Application Publication No. 2004-363563

The aforementioned as well as yet other objects, features, and effects of the present disclosure will be made clear by the following description of the preferred embodiments made with reference to the accompanying drawings.

DESCRIPTION OF EMBODIMENTS

Figure 1:
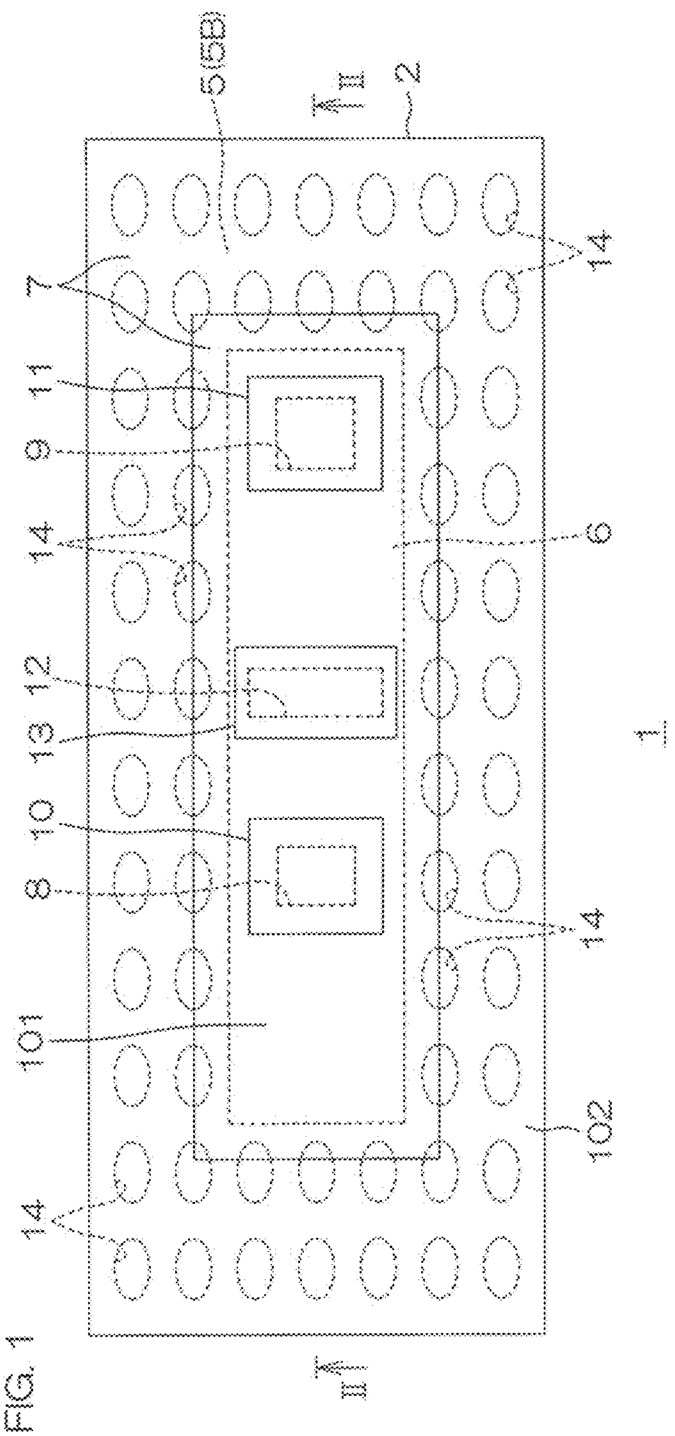
FIG. 1 is a plan view for describing the arrangement of a nitride semiconductor device according to a first preferred embodiment of the present disclosure.

Description of Preferred Embodiments of the Present Disclosure

A preferred embodiment of the present disclosure provides a nitride semiconductor device including a substrate that has a first main surface and a second main surface at an opposite side thereto and a nitride epitaxial layer that is formed on the first main surface and where the nitride semiconductor device has, in plan view, an active region inside the nitride epitaxial layer in which a two-dimensional electron gas can form and an inactive region inside the nitride epitaxial layer in which the two-dimensional electron gas is not formed and includes a trench that, in at least the inactive region among the active region and the inactive region, is dug in from the second main surface of the substrate toward the first main surface of the substrate and an embedded metal that is formed inside the trench.

With the preferred embodiment of the present disclosure, the trench is formed in just the inactive region among the active region and the inactive region.

With the preferred embodiment of the present disclosure, the trench is formed in both the active region and the inactive region.

With the preferred embodiment of the present disclosure, a total volume of the trench present inside the inactive region is not less than ⅓ of a volume of the substrate inside the inactive region.

With the preferred embodiment of the present disclosure, a lead-out metal that is formed on the second main surface and is thermally connected to the embedded metal is included.

With the preferred embodiment of the present disclosure, the trench is dug in from the second main surface toward the first main surface and up to an intermediate portion of the substrate.

With the preferred embodiment of the present disclosure, the trench penetrates through the substrate and reaches the nitride epitaxial layer.

With the preferred embodiment of the present disclosure, a source electrode, a drain electrode, and a gate electrode that are disposed on the nitride epitaxial layer and a contact metal that penetrates through the nitride epitaxial layer and electrically connects the source electrode and the embedded metal are included.

With the preferred embodiment of the present disclosure, the nitride epitaxial layer includes a first nitride semiconductor layer that constitutes an electron transit layer and a second nitride semiconductor layer that is formed on the first nitride semiconductor layer, constitutes an electron supply layer, and is higher in bandgap than the first nitride semiconductor layer.

With the preferred embodiment of the present disclosure, a semi-insulating nitride layer that is disposed between the substrate and the first nitride semiconductor layer and with which an acceptor concentration is higher than a donor concentration is included.

With the preferred embodiment of the present disclosure, a buffer layer that is disposed between the substrate and the semi-insulating nitride layer and is constituted of a nitride semiconductor is included.

With the preferred embodiment of the present disclosure, the first nitride semiconductor layer is constituted of a GaN layer and the second nitride semiconductor layer is constituted of an AlGaN layer.

With the preferred embodiment of the present disclosure, the first nitride semiconductor layer is constituted of a GaN layer, the second nitride semiconductor layer is constituted of an AlGaN layer, and the semi-insulating nitride layer is constituted of a GaN layer that contains carbon.

With the preferred embodiment of the present disclosure, the first nitride semiconductor layer is constituted of a GaN layer, the second nitride semiconductor layer is constituted of an AlGaN layer, the semi-insulating nitride layer is constituted of a GaN layer that contains carbon, and the buffer layer is constituted of a laminated film of an AlN layer formed on the first main surface and an AlGaN layer that is laminated on the AlN layer.

With the preferred embodiment of the present disclosure, the first nitride semiconductor layer is constituted of a GaN layer, the second nitride semiconductor layer is constituted of an AlGaN layer, the semi-insulating nitride layer is constituted of a GaN layer that contains carbon, and the buffer layer is constituted of an AlN layer or an AlGaN layer.

DETAILED DESCRIPTION OF PREFERRED EMBODIMENTS OF THE PRESENT DISCLOSURE

In the following, preferred embodiments of the present disclosure shall be described in detail with reference to the accompanying drawings.

Figure 2:
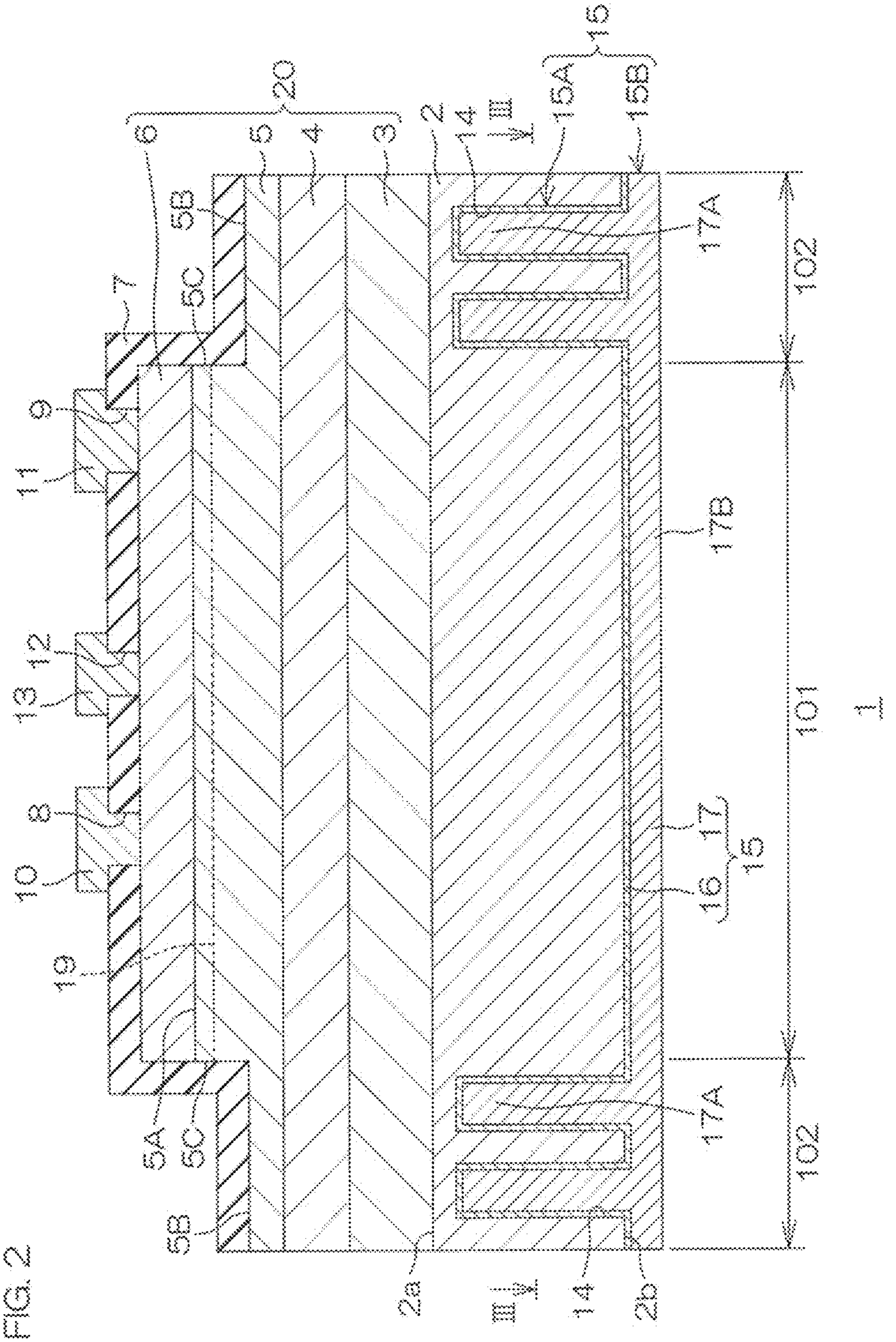
FIG. 2 is a sectional view taken along line II-II of FIG. 1.
Figure 3:
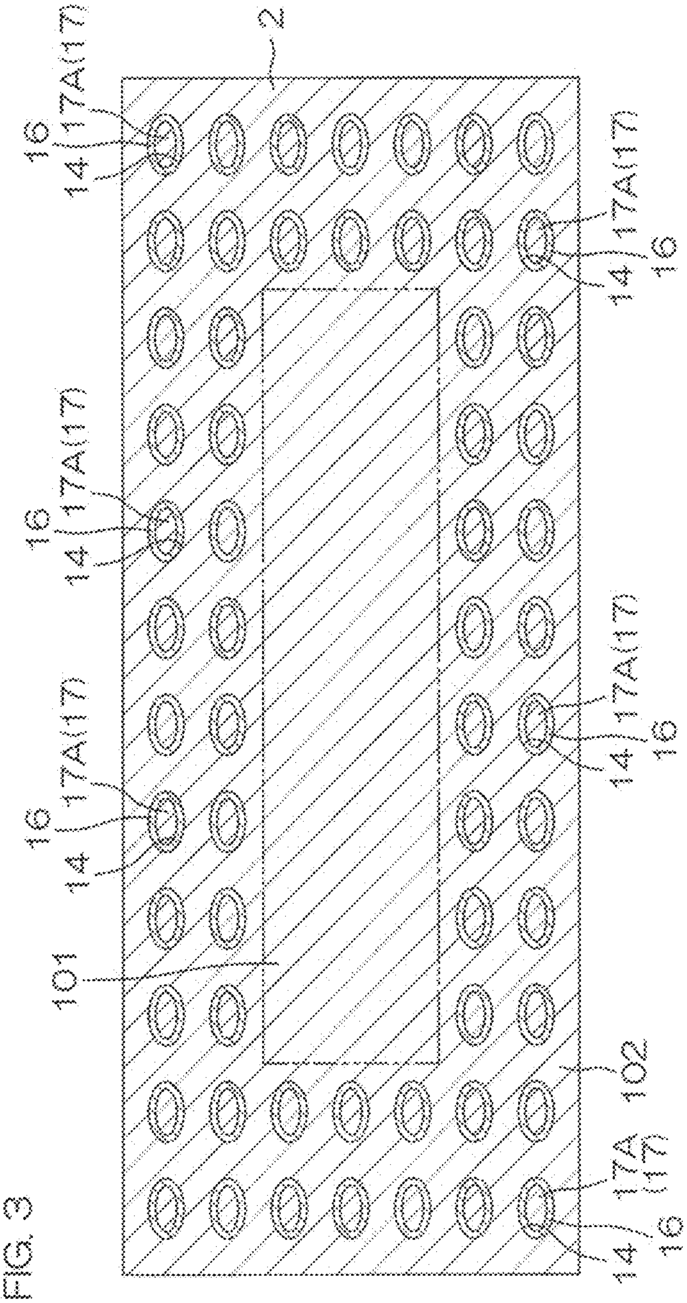
FIG. 3 is a sectional view taken along line III-III of FIG. 2.

FIG. 1 is a plan view for describing the arrangement of a nitride semiconductor device according to a first preferred embodiment of the present disclosure. FIG. 2 is a sectional view taken along line II-II of FIG. 1. FIG. 3 is a sectional view taken along line III-III of FIG. 2.

In the following, a right/left direction of the sheet surface of FIG. 1 shall be referred to as a lateral direction and an up/down direction of the sheet surface of FIG. 1 shall be referred to as a vertical direction in some cases.

As shown in FIG. 1, a nitride semiconductor device 1 is, for example, of a rectangular parallelepiped shape that is long in the lateral direction.

The nitride semiconductor device 1 includes a substrate 2 that has a first main surface (front surface) 2*a* and a second main surface (rear surface) 2*b* at an opposite side thereto and a nitride epitaxial layer 20 that is formed on the first main surface 2*a* of the substrate 2. The nitride epitaxial layer 20 includes a buffer layer 3 that is formed on the first main surface 2*a* of the substrate 2, a semi-insulating nitride layer 4 that is formed on the buffer layer 3, a first nitride semiconductor layer 5 that is formed on the semi-insulating nitride layer 4, and a second nitride semiconductor layer 6 that is formed on the first nitride semiconductor layer 5.

Further, the nitride semiconductor device 1 includes an insulating film 7 that is formed on the second nitride semiconductor layer 6. Further, the nitride semiconductor device 1 includes a source electrode 10 and a drain electrode 11 that penetrate through a source contact hole 8 and a drain contact hole 9 formed in the insulating film 7 and are in ohmic contact with the second nitride semiconductor layer 6. The source electrode 10 and the drain electrode 11 are disposed at an interval.

Further, the nitride semiconductor device 1 includes a gate electrode 13 that penetrates through a gate contact hole 12 formed in the insulating film 7 and is in contact with the second nitride semiconductor layer 6. The gate electrode 13 is disposed between the source electrode 10 and the drain electrode 11. Further, the nitride semiconductor device 1 has a heat dissipation structure 15.

In this preferred embodiment, the substrate 2 is constituted of an Si (silicon) substrate of low resistance. The substrate 2 may contain, for example, a p-type impurity. A p-type impurity concentration may, for example, be $1\times10^{17}$ $cm^{-3}$ to $1\times10^{20}$ $cm^{-3}$. A thickness of the substrate 2 is, for example, approximately 100 μm to 700 μm. In this preferred embodiment, the thickness of the substrate 2 is approximately 200 μm.

The buffer layer 3 is a buffer layer that buffers strain resulting from mismatch of a lattice constant of the semi-insulating nitride layer 4 formed on the buffer layer 3 and a lattice constant of the substrate 2. In this preferred embodiment, the buffer layer 3 is constituted of a multilayer buffer layer in which a plurality of nitride semiconductor films are laminated. In this preferred embodiment, the buffer layer 3 is constituted of a laminated film of an AlN film in contact with the front surface of the substrate 2 and an AlGaN film laminated on a front surface (surface at an opposite side to the substrate 2) of the AlN film. The buffer layer 3 may instead be constituted of a single film of an AlN film or a single film of an AlGaN. A thickness of the buffer layer 3 is, for example, approximately 0.1 μm to 5 μm. In this preferred embodiment, the thickness of the buffer layer 3 is approximately 0.5 μm.

The semi-insulating nitride layer 4 is provided to suppress a leak current. The semi-insulating nitride layer 4 is constituted of a GaN layer that is doped with an impurity and a thickness thereof is approximately 1 μm to 10 μm. In this preferred embodiment, the thickness of the semi-insulating nitride layer 4 is approximately 2 μm. The impurity is, for example, C (carbon) and is doped such that a difference between an acceptor concentration Na and a donor concentration Nd (Na—Nd) is approximately $1\times10^{17}$ $cm^{-3}$.

The first nitride semiconductor layer 5 constitutes an electron transit layer. In this preferred embodiment, the first nitride semiconductor layer 5 is constituted of an n-type GaN layer that is doped with a donor type impurity and a thickness thereof is approximately 0.05 μm to 1 μm. In this preferred embodiment, the thickness of the first nitride semiconductor layer 5 is approximately 0.2 μm. Also, the first nitride semiconductor layer 5 may be constituted of an undoped GaN layer instead.

In regard to the first nitride semiconductor layer 5, a lower surface at the semi-insulating nitride layer 4 side shall be referred to as a rear surface and an upper surface at an opposite side thereto shall be referred to as a front surface. A central portion 5A of the front surface of the first nitride semiconductor layer 5 that is of a laterally long rectangle shape in plan view protrudes further than a peripheral edge portion 5B of the front surface that is of a rectangular annular shape. A step is thereby formed between the central portion 5A and the peripheral edge portion 5B of the front surface of the first nitride semiconductor layer 5. The front surface (upper surface) of the first nitride semiconductor layer 5 is thus constituted of the central portion 5A that is a high step portion, the peripheral edge portion 5B that is a low step portion, and a connecting portion 5C that connects the two.

The second nitride semiconductor layer 6 is formed on the central portion 5A of the front surface of the first nitride semiconductor layer 5. The second nitride semiconductor layer 6 constitutes an electron supply layer. The second nitride semiconductor layer 6 is constituted of a nitride semiconductor of greater bandgap than the first nitride semiconductor layer 5. Specifically, the second nitride semiconductor layer 6 is constituted of a nitride semiconductor of higher Al composition than the first nitride semiconductor layer 5. In a nitride semiconductor, the higher the Al composition, the greater the bandgap. In this preferred embodiment, the second nitride semiconductor layer 6 is constituted of an $Al_{x1}Ga_{1-x1}N$ layer ($0<x1\leq1$) and a thickness thereof is approximately 1 nm to 100 nm. In this preferred embodiment, the thickness of the second nitride semiconductor layer 6 is approximately 20 nm and x1=0.2.

The first nitride semiconductor layer 5 (electron transit layer) and the second nitride semiconductor layer 6 (electron supply layer) are thus constituted of nitride semiconductors that differ in bandgap (Al composition) and a lattice mismatch occurs therebetween. Also, due to spontaneous polarizations of the first nitride semiconductor layer 5 and the second nitride semiconductor layer 6 and a piezo polarization due to the lattice mismatch between the two, an energy level of a conduction band of the first nitride semiconductor layer 5 at an interface between the first nitride semiconductor layer 5 and the second nitride semiconductor layer 6 is made lower than a Fermi level. Thereby, inside the first nitride semiconductor layer 5, a two-dimensional electron gas (2DEG) 19 spreads at a position close to the interface with the second nitride semiconductor layer 6 (for example, at a distance of only several A from the interface).

In plan view, a region in which the two-dimensional electron gas 19 can be formed shall be referred to as an active region 101 and a region in which the two-dimensional electron gas (2DEG) 19 is not formed shall be referred to as an inactive region 102. In this preferred embodiment, a region in which the central portion 5A of the front surface of the first nitride semiconductor layer 5 is present in plan view is the active region 101 and a region in which the peripheral edge portion 5B of the front surface of the first nitride semiconductor layer 5 is present in plan view is the inactive region 102.

The insulating film 7 is formed across substantially an entire area of a front surface of the second nitride semiconductor layer 6. In this preferred embodiment, the insulating film 7 is constituted of SiN. A thickness of the insulating film 7 is, for example, approximately 10 nm to 200 nm. In this preferred embodiment, the thickness of the insulating film 7 is approximately 100 nm. Besides SiN, the insulating film 7 may be constituted of $SiO_2$, SiN, SiON, $Al_2O_3$, AlN, AlON, HfO, HfN, HfON, HfSiON, AlON, etc.

The source electrode 10 covers the source contact hole 8 and a peripheral edge portion of the source contact hole 8 at an insulating film 7 front surface. A portion of the source electrode 10 enters into the source contact hole 8 and contacts the front surface of the second nitride semiconductor layer 6 inside the source contact hole 8.

The drain electrode 11 covers the drain contact hole 9 and a peripheral edge portion of the drain contact hole 9 at the insulating film 7 front surface. A portion of the drain electrode 11 enters into the drain contact hole 9 and contacts the front surface of the second nitride semiconductor layer 6 inside the drain contact hole 9.

The source electrode 10 and the drain electrode 11 are each constituted, for example, of a Ti/Al laminated film in which a Ti film and an Al film are laminated in that order from a lower layer. A thickness of the Ti film at the lower layer side is, for example, approximately 20 nm and a thickness of the Al film at an upper layer side is, for example, approximately 300 nm.

The source electrode 10 and the drain electrode 11 suffices to be constituted of a material with which ohmic contact can be established with respect to the second nitride semiconductor layer 6 (AlGaN layer). The source electrode 10 and the drain electrode 11 may each be constituted of a Ti/Al/

Ni/Au laminated film in which a Ti film, an Al film, an Ni film, and an Au film are laminated in that order from a lower layer.

The gate electrode 13 covers the gate contact hole 12 and a peripheral edge portion of the gate contact hole 12 at the insulating film 7 front surface. A portion of the gate electrode 13 enters into the gate contact hole 12 and contacts the front surface of the second nitride semiconductor layer 6 inside the gate contact hole 12.

The gate electrode 13 is constituted, for example, of an Ni/Au laminated film in which an Ni film and an Au film are laminated in that order from a lower layer. A thickness of the Ni film at the lower layer side is, for example, approximately 10 nm and a thickness of the Au film at an upper layer side is, for example, approximately 600 nm. The gate electrode 13 suffices to be constituted of a material with which a Schottky barrier can be formed with respect to the second nitride semiconductor layer 6 (AlGaN layer).

The heat dissipation structure 15 shall now be described. In this preferred embodiment, a plurality of trenches 14 that are dug in from the second main surface 2*b* toward the first main surface 2*a* are formed in the substrate 2 in the inactive region 102. In this preferred embodiment, the trenches 14 are dug in from the second main surface 2*b* toward the first main surface 2*a* and up to an intermediate thickness of the substrate 2. In this preferred embodiment, a transverse cross-sectional shape of each trench 14 is an elliptical shape. In plan view, the plurality of trenches 14 are disposed in a lattice. In this preferred embodiment, the plurality of trenches 14 are disposed in a matrix in plan view. The plurality of trenches 14 may instead be disposed in a staggered arrangement in plan view.

The shape of the transverse cross section of each trench 14 is arbitrary and may be a circular shape or a polygonal shape (triangular shape, quadrilateral shape, hexagonal shape, etc.). Also, a size of the transverse cross section (area of the transverse cross section) of each trench 14 and an interval between two adjacent trenches 14 can be set arbitrarily. A depth of each trench 14 is preferably not less than ½ the thickness of the substrate 2, more preferably not less than ⅔ the thickness of the substrate 2, and even more preferably not less than ¾ the thickness of the substrate 2. A total of volumes (total volume) of the plurality of trenches 14 present in the inactive region 102 is preferably not less than ⅓ the volume of the substrate 2 inside the inactive region 102.

A barrier metal film 16 is formed across entire areas of inner surfaces (side surfaces and bottom surfaces) of the respective trenches 14 and an entire area of the second main surface 2*b* of the substrate 2. The barrier metal film 16 is constituted, for example, of TiN.

Also, inside the respective trenches 14, a heat dissipation metal 17 is embedded in a state of being surrounded by the barrier metal film 16. The heat dissipation metal 17 is constituted of a metal of high thermal conductivity such as gold (Au), copper (Cu), etc. In this preferred embodiment, the heat dissipation metal 17 is constituted of gold (Au). The heat dissipation metal 17 includes embedded portions 17A inside the trenches 14 and a lead-out portion 17B that, outside the trenches 14, is led out along the second main surface 2*b* of the substrate 2 from opening ends of the trenches 14. The lead-out portion 17B is led out uniformly from the respective trenches 14 and covers the entire area of the second main surface 2*b* of the substrate 2. A rear surface of the heat dissipation metal 17 (rear surface of the lead-out portion 17B) is formed to a flat shape across its entirety.

Embedded metals 15A of the present disclosure are constituted of the barrier metal film 16 inside the trenches 14 and the embedded portions 17A that are surrounded by the barrier metal film 16. A lead-out metal 15B of the present disclosure is constituted of the barrier metal film 16 formed on the second main surface 2*b* of the substrate 2 and the lead-out portion 17B. The heat dissipation structure 15 is constituted of the embedded metals 15A inside all of the trenches 14 and the lead-out metal 15B. In other words, the heat dissipation structure 15 is constituted of the barrier metal film 16 and the heat dissipation metal 17.

Here, the heat dissipation metal 17 does not have to be embedded completely inside the trenches 14. In this case, the rear surface of the heat dissipation metal 17 does not have to be flat. Also, the barrier metal film 16 and the heat dissipation metal 17 does not have to be formed on the second main surface 2*b* of the substrate 2.

With the nitride semiconductor device 1, a heterojunction is formed by there being formed, on the first nitride semiconductor layer 5 (electron transit layer), the second nitride semiconductor layer 6 that differs in bandgap (Al composition). Thereby, the two-dimensional electron gas 19 is formed inside the first nitride semiconductor layer 5 near the interface of the first nitride semiconductor layer 5 and the second nitride semiconductor layer 6 and an HEMT that uses the two-dimensional electron gas 19 as a channel is formed.

In a state where a control voltage is not applied to the gate electrode 13, the source electrode 10 and the drain electrode 11 are connected to each other with the two-dimensional electron gas 19 as the channel. Therefore, the HEMT is of a normally-on type. When the control voltage such that a potential at the gate electrode 13 is made negative with respect to the source electrode 10 is applied to the gate electrode 13, the two-dimensional electron gas 19 is interrupted and the HEMT is put in an off state.

With this preferred embodiment, heat dissipation can be enhanced because the embedded metals 15A are provided. Also, with this preferred embodiment, the heat dissipation can be enhanced further because the lead-out metal 15B is provided.

FIG. 4A to FIG. 4I are sectional views for describing an example of a manufacturing process of the nitride semiconductor device 1 described above and show a sectional structure in a plurality of stages of the manufacturing process.

Figure 4A:
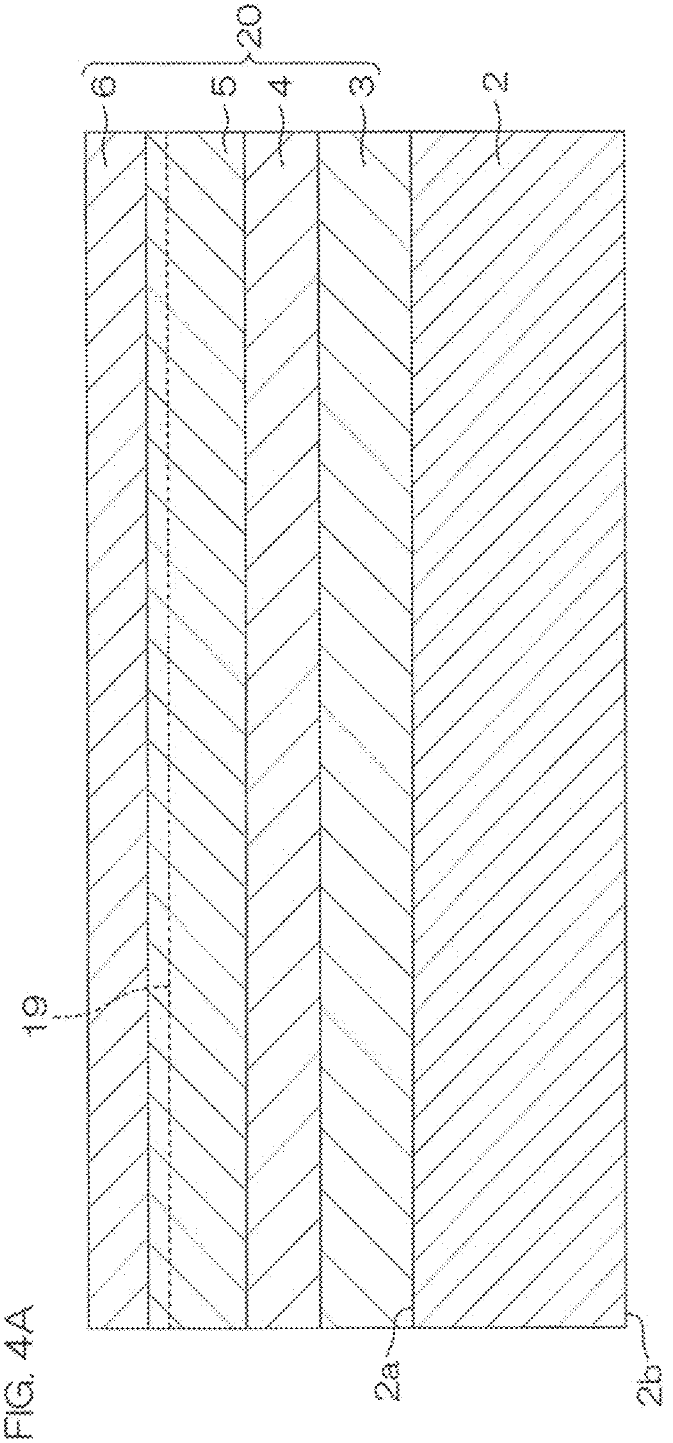
FIG. 4A is a sectional view showing an example of a manufacturing process of the nitride semiconductor device.

First, as shown in FIG. 4A, the buffer layer 3 and the semi-insulating nitride layer 4 are epitaxially grown successively on the first main surface 2*a* of the substrate 2, for example, by an MOCVD (metal organic chemical vapor deposition) method. Further, the first nitride semiconductor layer (electron transit layer) 5 and the second nitride semiconductor layer (electron supply layer) 6 are epitaxially grown successively on the semi-insulating nitride layer 4 by the MOCVD method. The nitride epitaxial layer 20 constituted of the buffer layer 3, the semi-insulating nitride layer 4, the first nitride semiconductor layer 5, and the second nitride semiconductor layer 6 is thereby formed on the first main surface 2*a* of the substrate 2.

Figure 4B:
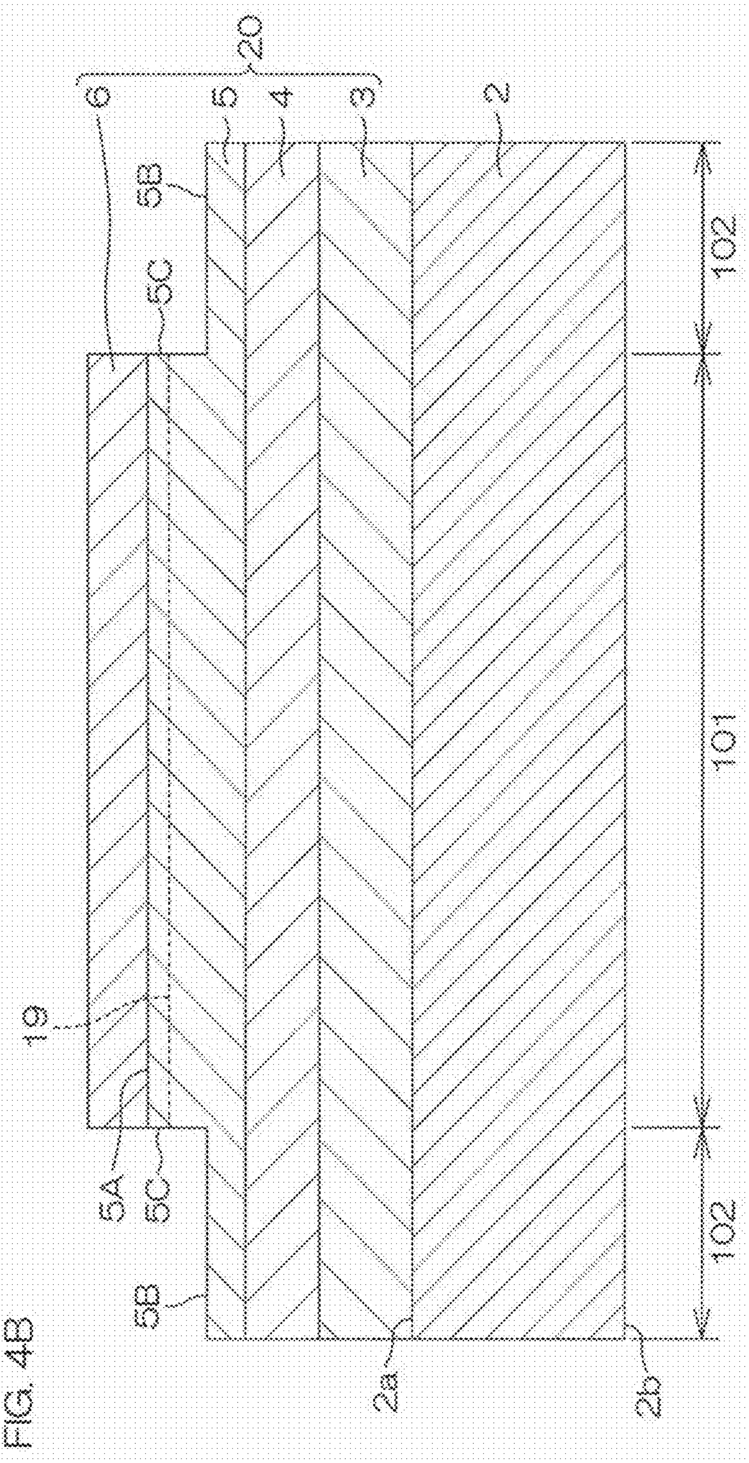
FIG. 4B is a sectional view showing a step subsequent to that of FIG. 4A.

Next, a resist film (not shown) that covers a region directly above a planned formation region of the central portion 5A of the front surface of the first nitride semiconductor layer 5 is formed on the second nitride semiconductor layer 6. By dry etching using the resist film as a mask, a peripheral edge portion of the second nitride semiconductor layer 6 is removed and a peripheral edge portion of the first nitride semiconductor layer 5 is removed up to an intermediate thickness as shown in FIG. 4B. The front surface of the first nitride semiconductor layer 5 is thereby made to be constituted of the central portion 5A that is the high step portion, the peripheral edge portion 5B that is the low step portion, and the connecting portion 5C that connects the two. As the etching gas, for example, a chlorine-based gas such as $Cl_2$, $BCl_3$, etc., is used.

The inactive region 102 in which the two-dimensional electron gas 19 is not formed is thereby formed. In plan view, the region corresponding to the central portion 5A of the front surface of the first nitride semiconductor layer 5 is the active region 101 and, in plan view, the region corresponding to the peripheral edge portion 5B of the front surface of the first nitride semiconductor layer 5 is the active region 102.

Here, the etching may be performed until an etching bottom surface reaches an upper surface of the semi-insulating nitride layer 4 or until it reaches an intermediate thickness of the semi-insulating nitride layer 4. Also, the etching may be performed until the etching bottom surface reaches an upper surface of the buffer layer 3 or until it reaches an intermediate thickness of the buffer layer 3.

Figure 4C:
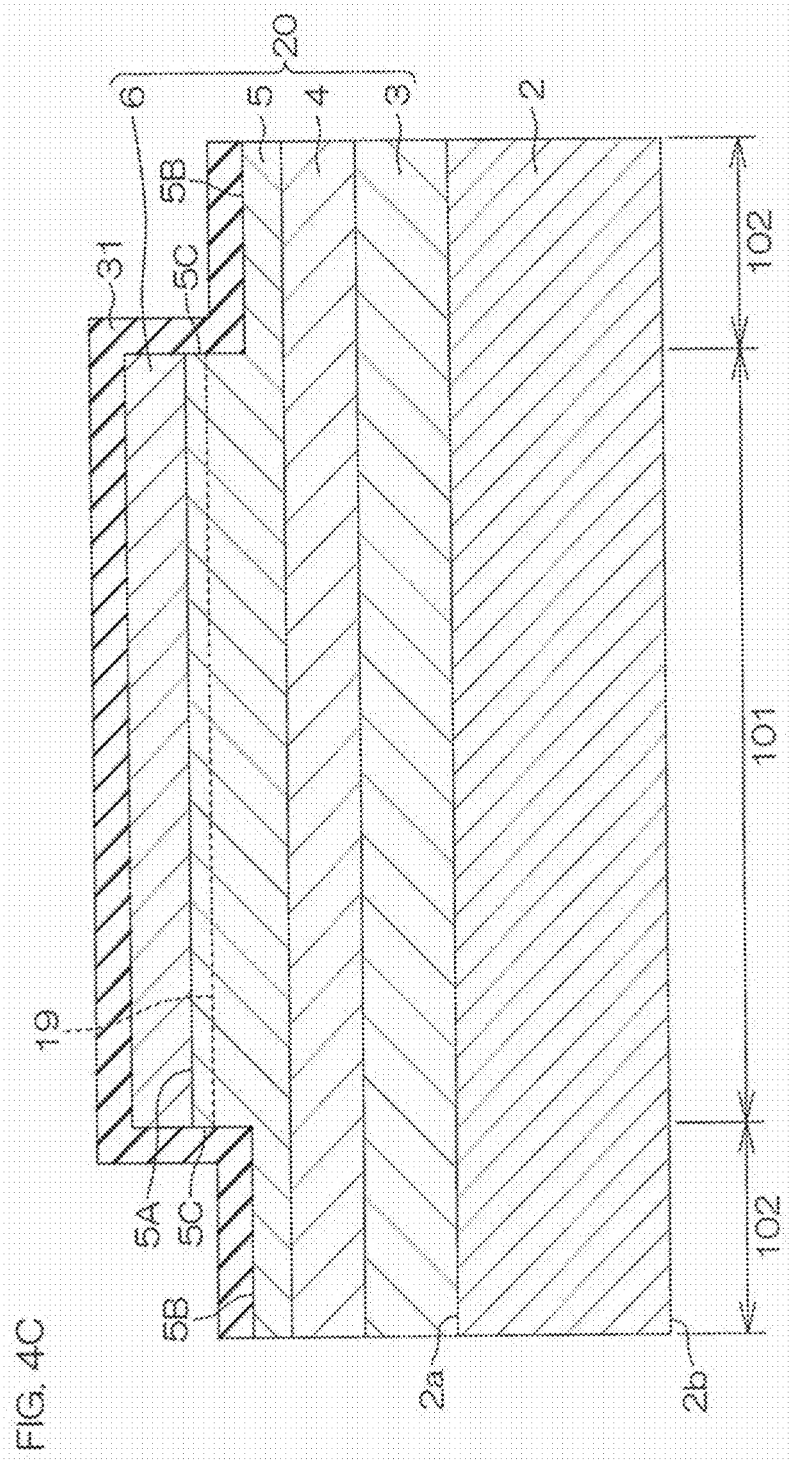
FIG. 4C is a sectional view showing a step subsequent to that of FIG. 4B.

Next, as shown in FIG. 4C, by a plasma CVD method, LPCVD (low pressure CVD) method, MOCVD method, sputtering method, etc., an insulating material film 31 that is a material film of the insulating film 7 is formed such as to cover the peripheral edge portion 5B and the connecting portion 5C of the front surface of the first nitride semiconductor layer 5 and exposed surfaces of the second nitride semiconductor layer 6.

Figure 4D:
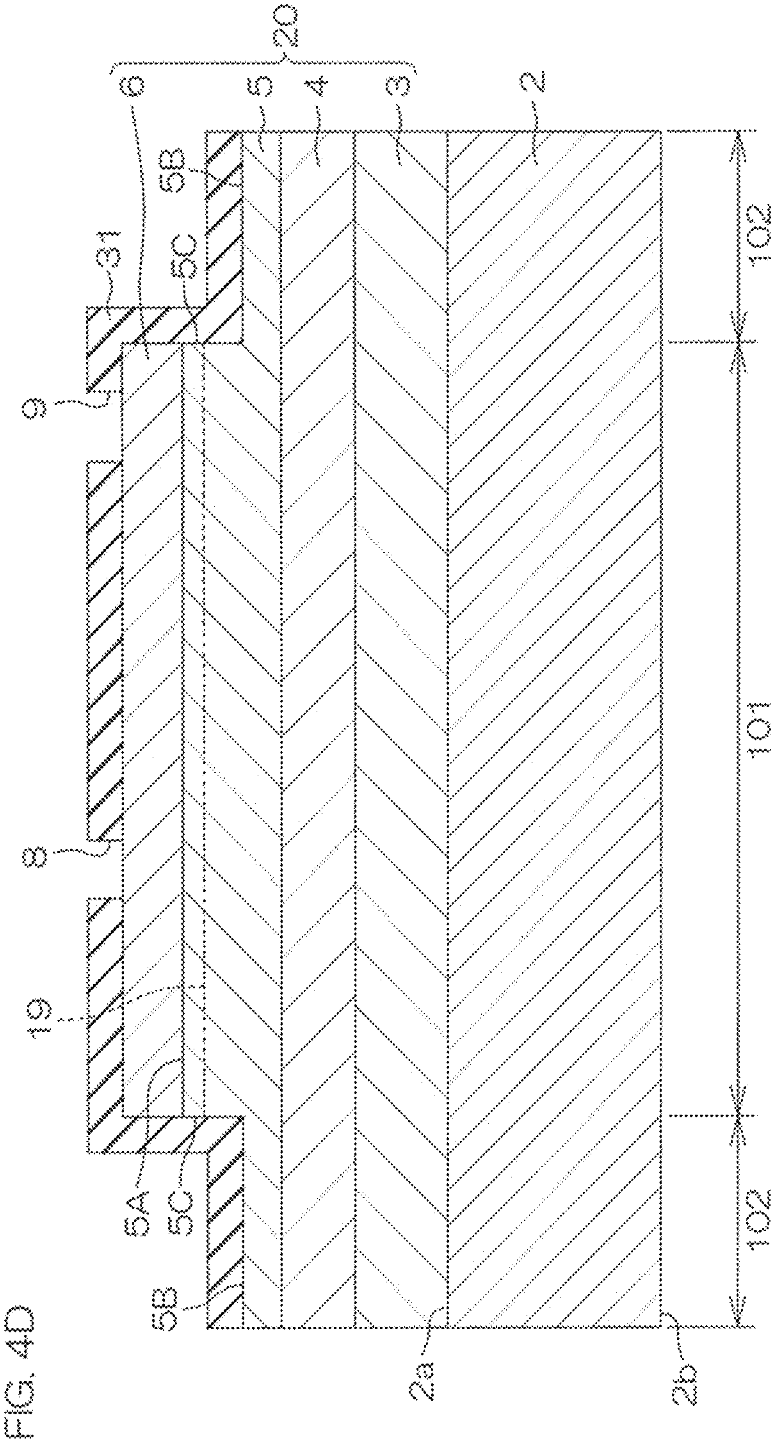
FIG. 4D is a sectional view showing a step subsequent to that of FIG. 4C.

Next, a resist film (not shown) is formed on the insulating material film 31 in a region excluding regions in which the source contact hole 8 and the drain contact hole 9 are to be formed. By the insulating material film 31 being, for example, dry etched via the resist film, the source contact hole 8 and the drain contact hole 9 are formed in the insulating material film 31 as shown in FIG. 4D.

The source contact hole 8 and the drain contact hole 9 penetrate through the insulating material film 31 and reach the second nitride semiconductor layer 6. A width of each of the source contact hole 8 and the drain contact hole 9 is approximately 3 to 5 μm. As the etching gas, for example, $CF_4$ gas is used. Thereafter, the resist film is removed.

Figure 4E:
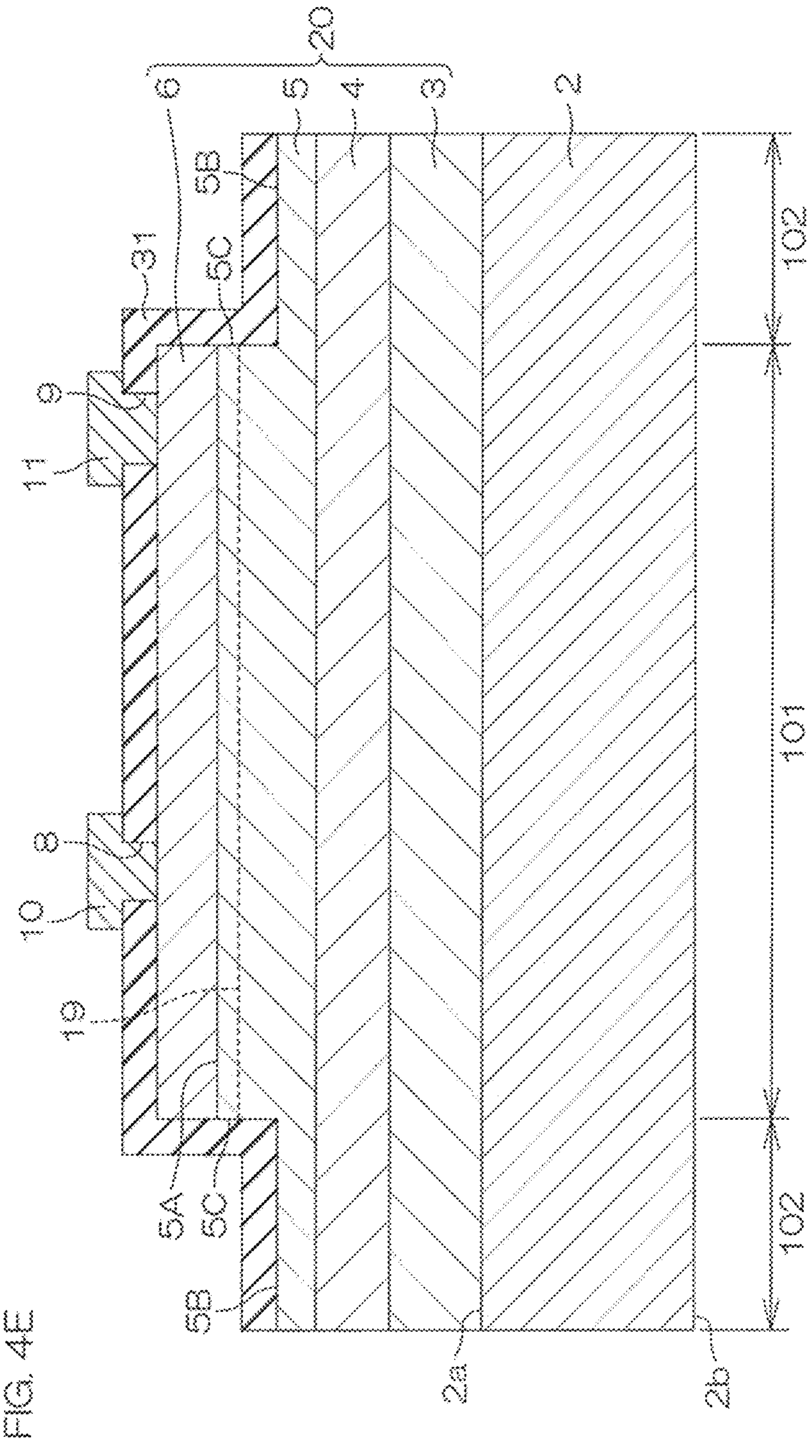
FIG. 4E is a sectional view showing a step subsequent to that of FIG. 4D.

Next, for example, by a vapor deposition method, sputtering method, etc., an electrode film that is a material film of the source electrode 10 and the drain electrode 11 is formed on the insulating material film 31. Thereafter, a resist film that covers a source electrode preparation planned region and a drain electrode preparation planned region of a front surface of the electrode film is formed. By the electrode film then being etched selectively using the resist film as a mask, the source electrode 10 and the drain electrode 11 are obtained as shown in FIG. 4E. Thereafter, the resist film is removed.

Figure 4F:
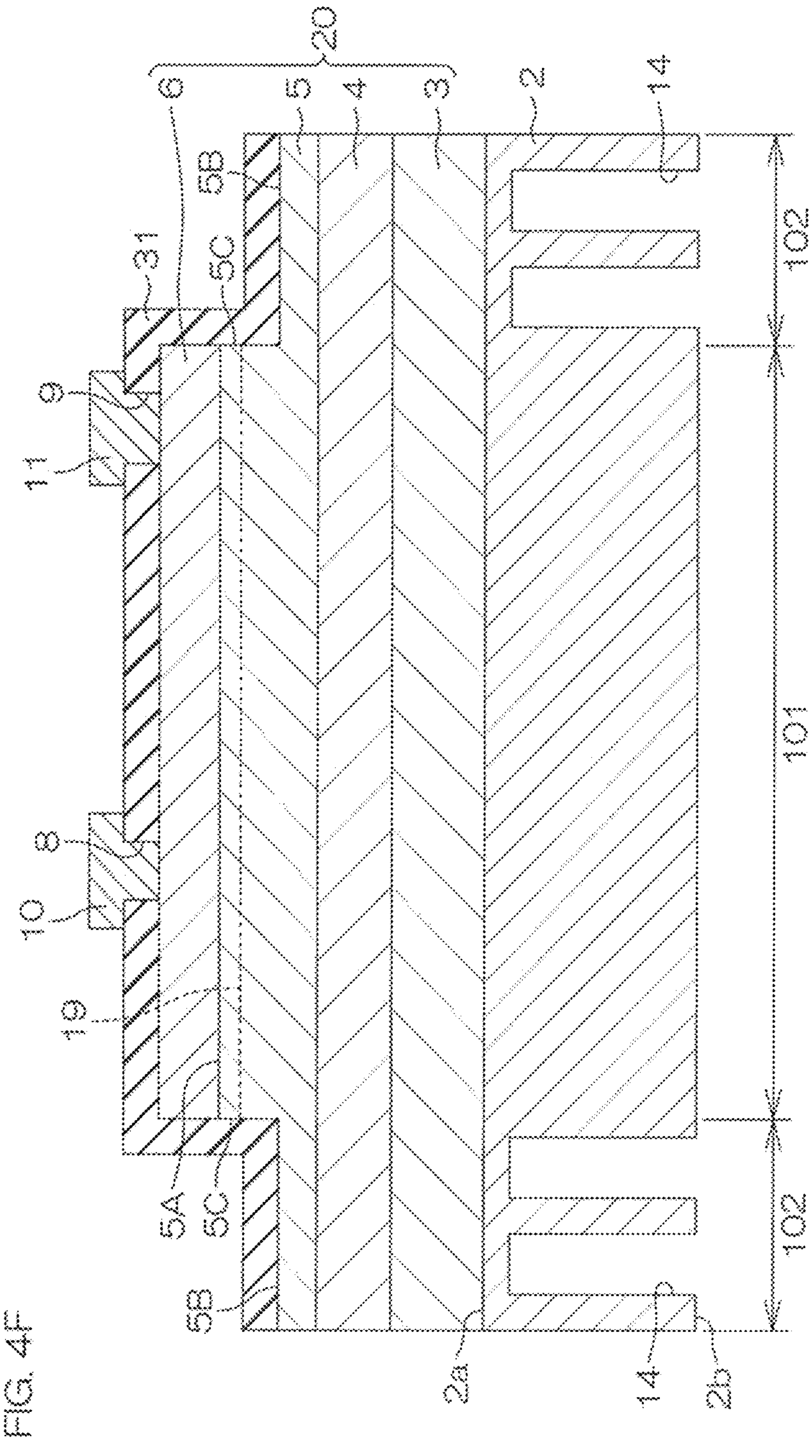
FIG. 4F is a sectional view showing a step subsequent to that of FIG. 4E.

Next, as shown in FIG. 4F, the plurality of trenches 14 that extend from the second main surface 2*b* toward the first main surface 2*a* and up to the intermediate thickness of the substrate 2 are formed in the substrate 2 in the inactive region 102 by photolithography and etching. As the etching, a Bosch process may be used. In this preferred embodiment, the plurality of trenches 14 are disposed in a matrix in plan view.

Figure 4G:
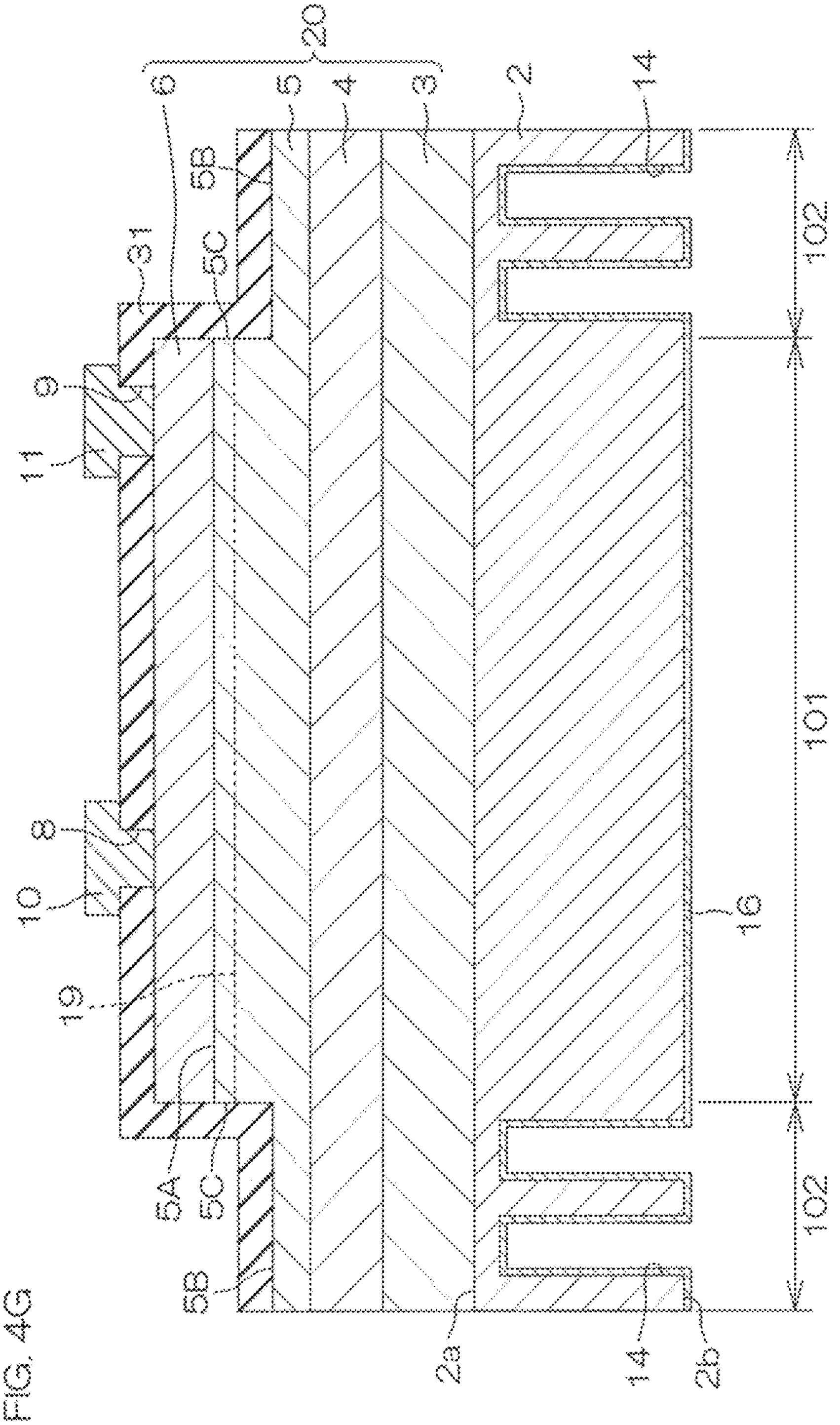
FIG. 4G is a sectional view showing a step subsequent to that of FIG. 4F.

Next, as shown in FIG. 4G, the barrier metal film 16 that is constituted, for example, of a TiN layer is formed on the inner surfaces (side surfaces and bottom surfaces) of the trenches 14 and the second main surface 2*b* of the substrate 2, for example, by a sputtering method.

Figure 4H:
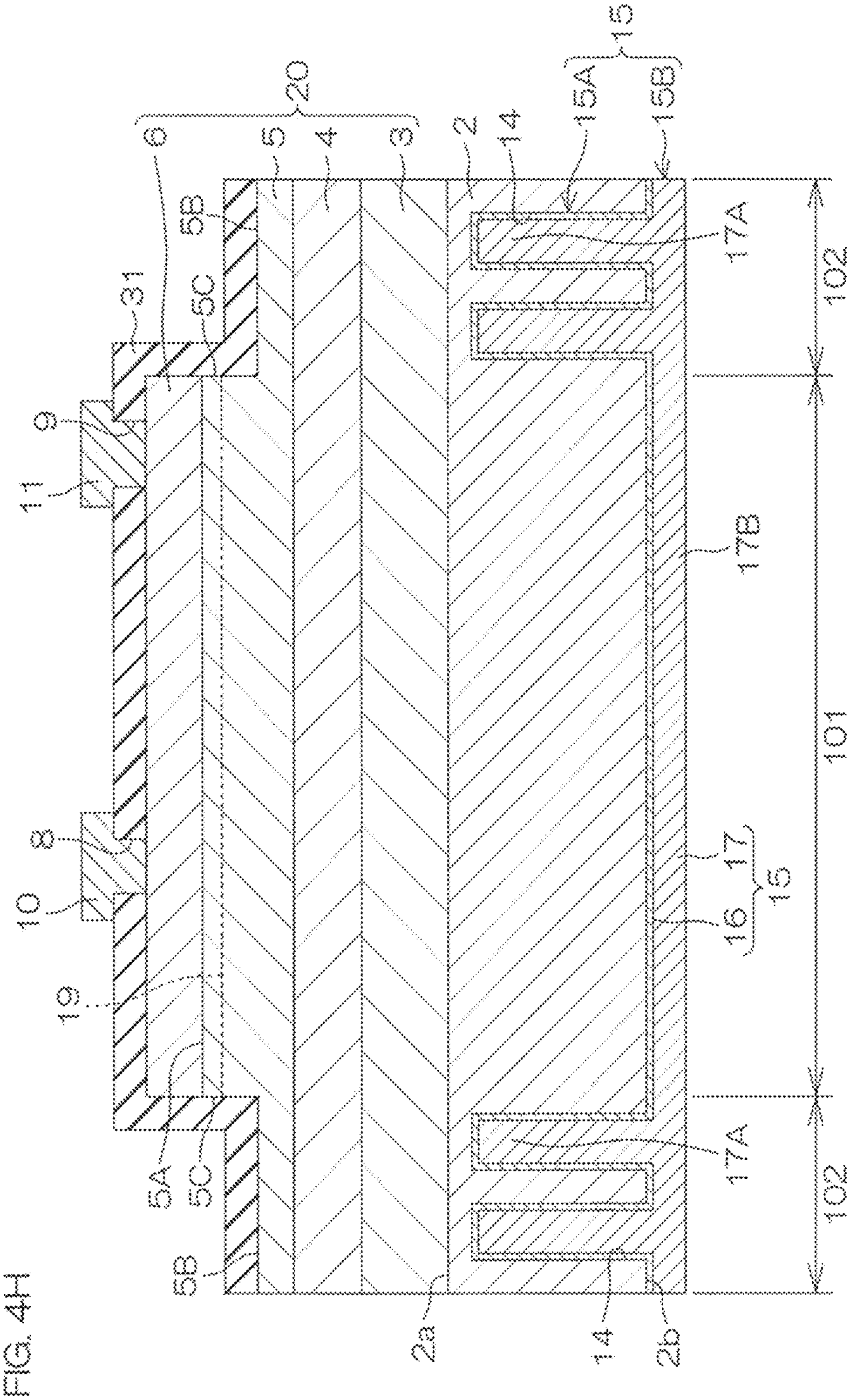
FIG. 4H is a sectional view showing a step subsequent to that of FIG. 4G.

Next, as shown in FIG. 4H, a film, for example, of gold (Au) is formed on the barrier metal film 16, for example by a plating method. Gold (Au) that is a material of the heat dissipation metal 17 is thereby embedded inside the trenches 14. The heat dissipation metal 17 constituted of the embedded portions 17A and the lead-out portion 17B is thereby formed. The heat dissipation structure 15 that is constituted of the barrier metal film 16 and the heat dissipation metal 17 is thereby formed. In other words, the heat dissipation structure 15 that is constituted of the embedded metals 15A embedded inside the respective trenches 14 and the lead-out metal 15B formed on the second main surface 2*b* is formed.

Figure 4I:
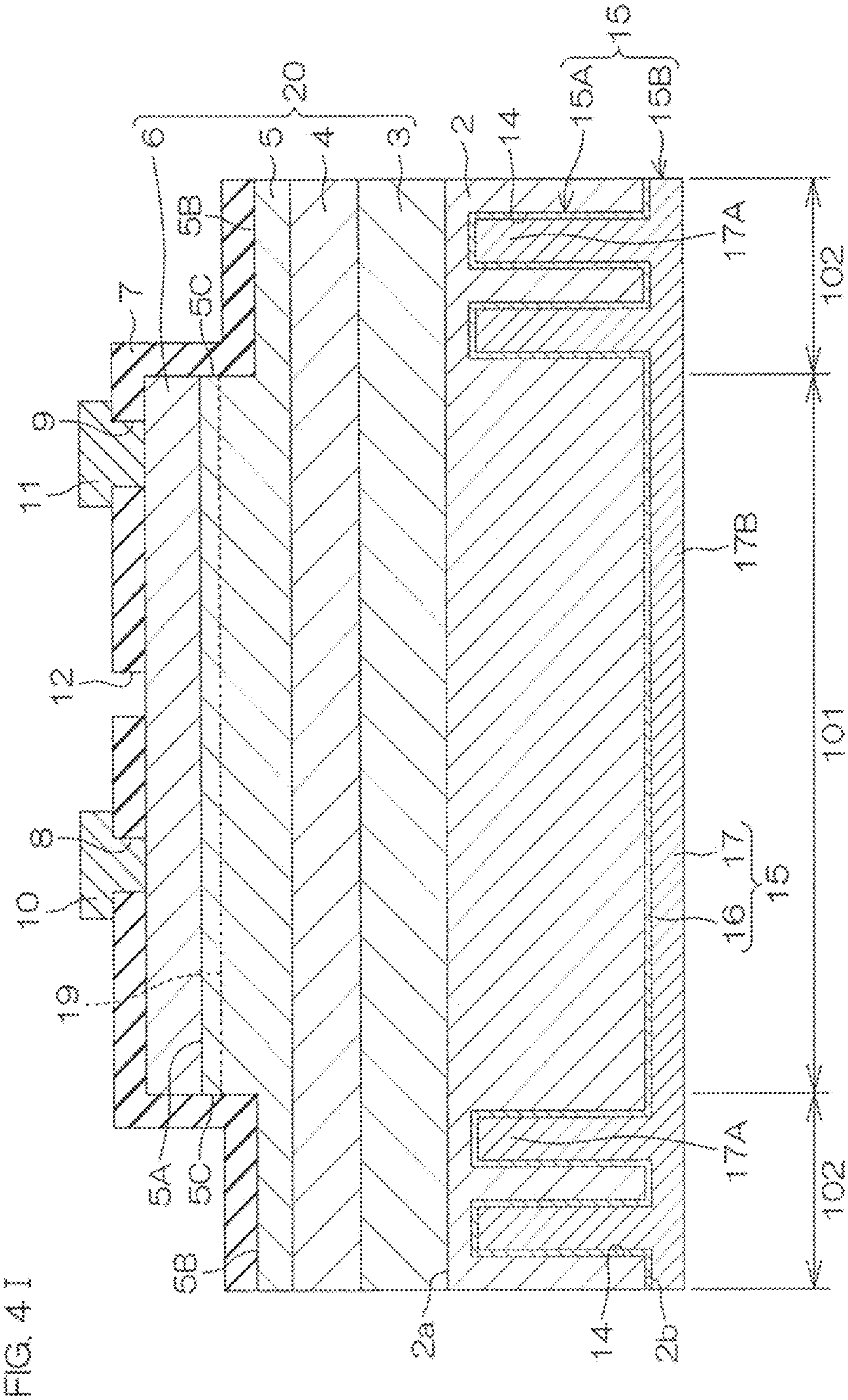
FIG. 4I is a sectional view showing a step subsequent to that of FIG. 4H.

Next, on the insulating material film 31, the source electrode 10, and the drain electrode 11, a resist film (not shown) is formed in a region excluding a region in which the gate contact hole 12 is to be formed. By the insulating material film 31 being etched via the resist film, the gate contact hole 12 is formed in the insulating material film 31 as shown in FIG. 4I. Thereby, the insulating material film 31 is patterned and the insulating film 7 is obtained. The gate contact hole 12 penetrates through the insulating film 7 and reaches the second nitride semiconductor layer 6. As the etching gas, for example, $CF_4$ gas is used.

Next, after removing the resist film, the gate electrode 13 is formed and the nitride semiconductor device 1 such as shown in FIG. 1 to FIG. 3 is thereby obtained. The gate electrode 13 is constituted, for example, of the Ni/Au laminated film in which the Ni film and the Au film are laminated in that order from the lower layer.

Figure 5:
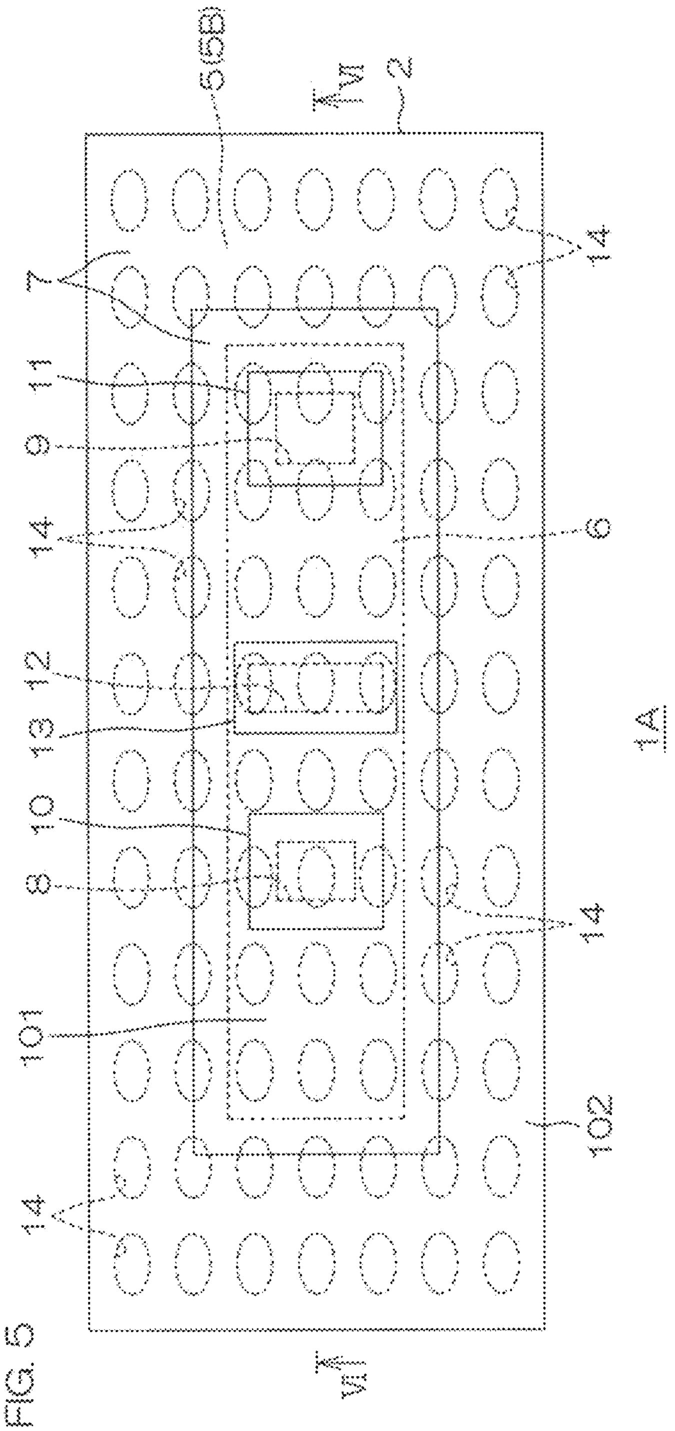
FIG. 5 is a plan view for describing the arrangement of a nitride semiconductor device according to a second preferred embodiment of the present disclosure.
Figure 6:
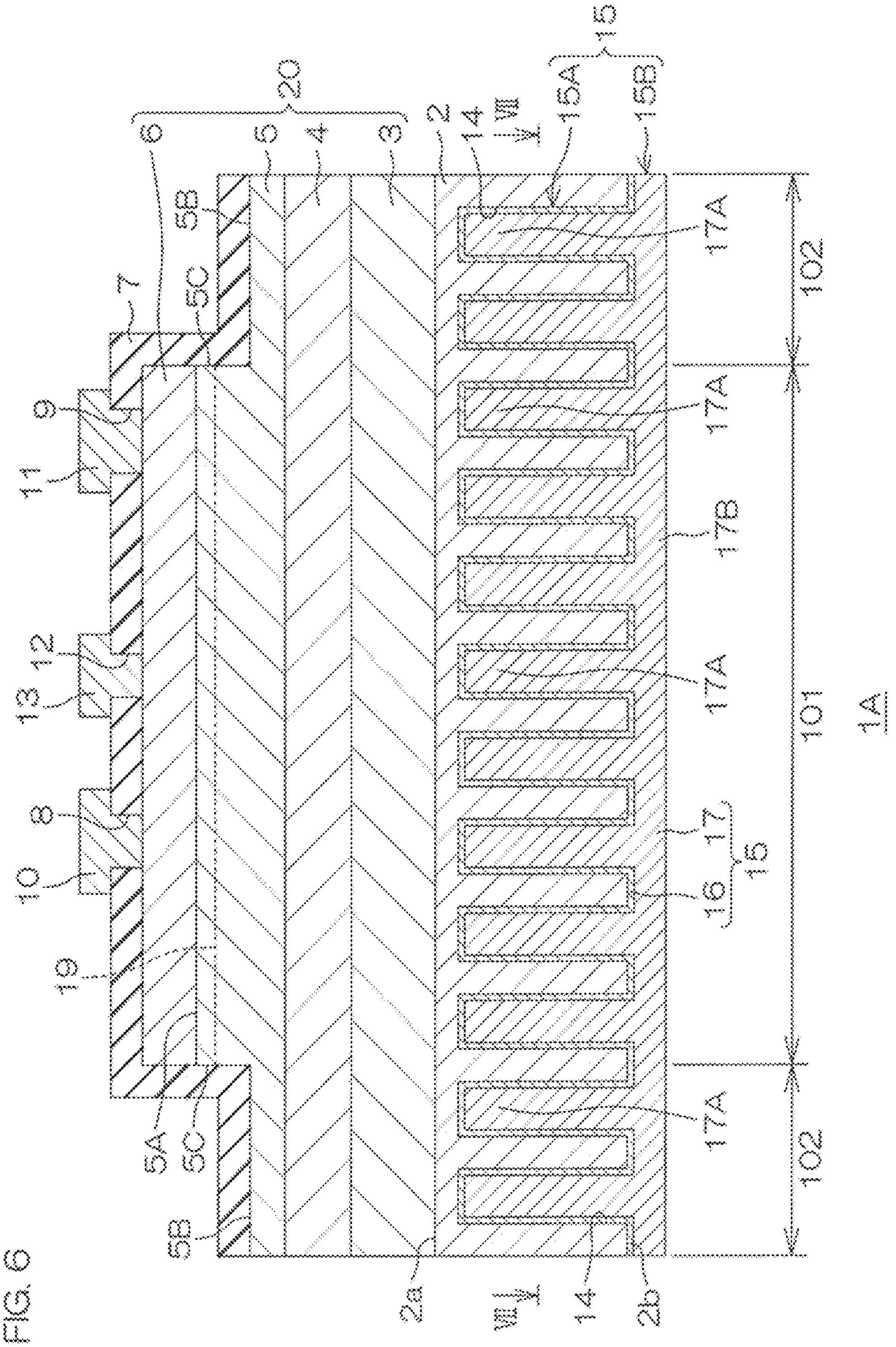
FIG. 6 is a sectional view taken along line VI-VI of FIG. 5.
Figure 7:
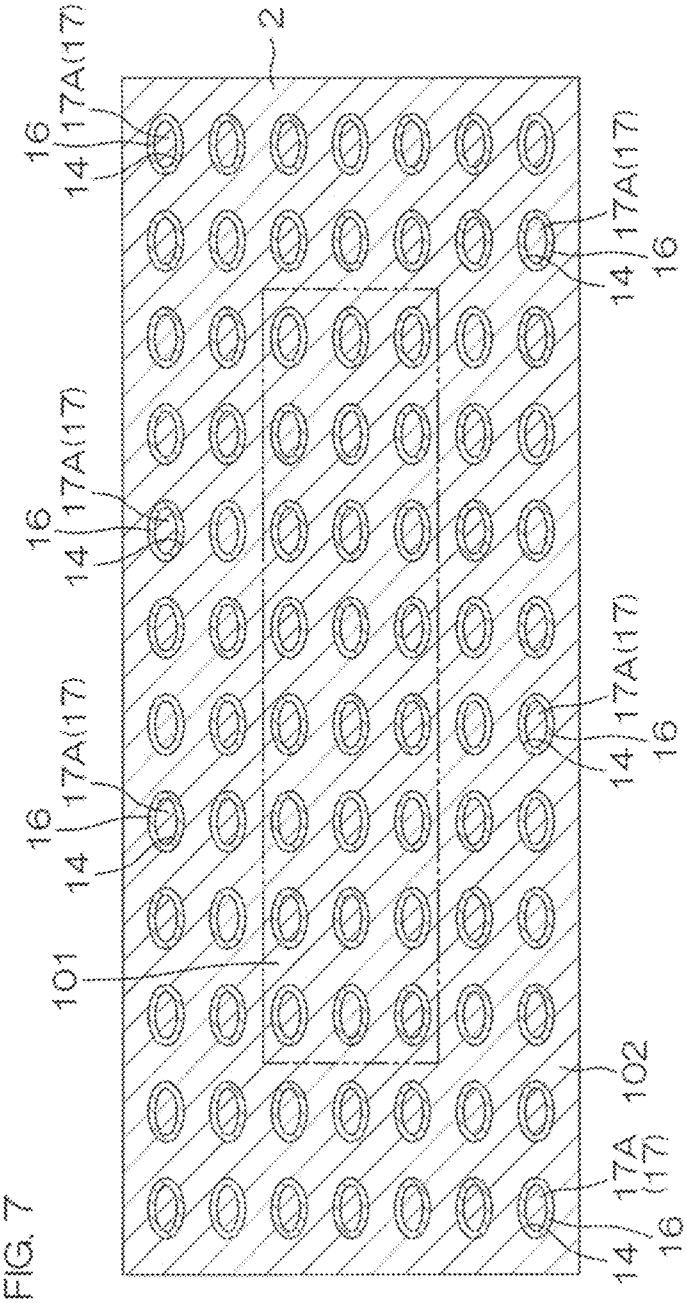
FIG. 7 is a sectional view taken along line VII-VII of FIG. 6.

FIG. 5 is a plan view for describing the arrangement of a nitride semiconductor device according to a second preferred embodiment of the present disclosure. FIG. 6 is a sectional view taken along line VI-VI of FIG. 5. FIG. 7 is a sectional view taken along line VII-VII of FIG. 6.

In FIG. 5, FIG. 6, and FIG. 7, portions corresponding to respective portions in FIG. 1, FIG. 2, and FIG. 3 described above are indicated with the same reference signs attached as in FIG. 1, FIG. 2, and FIG. 3.

A nitride semiconductor device 1A according to the second preferred embodiment differs from the nitride semiconductor device 1 according to the first preferred embodiment in that the trenches 14 are formed in the substrate 2 not just in the inactive region 102 but also in the active region 101.

A plurality of the trenches 14 are formed inside the active region 101 and the inactive region 102. The plurality of trenches 14 are disposed in a matrix in plan view. The plurality of trenches 14 may instead be disposed in a staggered arrangement in plan view. The barrier metal film 16 is formed on the inner surfaces of the plurality of trenches 14. Also, inside the trenches 14, the heat dissipation metal 17 is embedded in the state of being surrounded by the barrier metal film 16.

The embedded metals 15A of the present disclosure are constituted of the barrier metal film 16 inside the trenches 14 and the embedded portions 17A that are surrounded by the barrier metal film 16. The lead-out metal 15B of the present disclosure is constituted of the barrier metal film 16 formed on the second main surface 2*b* of the substrate 2 and the lead-out portion 17B. The heat dissipation structure 15 is constituted of the embedded metals 15A inside all of the trenches 14 and the lead-out metal 15B. In other words, the heat dissipation structure 15 is constituted of the barrier metal film 16 and the heat dissipation metal 17 that are formed in the active region 101 and the inactive region 102.

Even in the second preferred embodiment, the heat dissipation can be enhanced because the embedded metals 15A are provided. Also, the heat dissipation can be enhanced further because the lead-out metal 15B is provided. With the second preferred embodiment, since the plurality of trenches 14 are formed not just in the inactive region 102 but also in the active region 101 and the heat dissipation metal 17 is embedded inside the plurality of trenches 14 with the barrier metal film 16 interposed therebetween, the heat dissipation can be enhanced more in comparison to the first preferred embodiment.

FIG. 8A to FIG. 8D are sectional views for describing an example of a manufacturing process of the nitride semiconductor device 1A described above and show a sectional structure in a plurality of stages of the manufacturing process.

Even in manufacturing the nitride semiconductor device 1A shown in FIG. 5 to FIG. 7, the steps shown in FIG. 4A to FIG. 4E are carried out as in manufacturing the nitride semiconductor device 1 shown in FIG. 1 to FIG. 3.

Figure 8A:
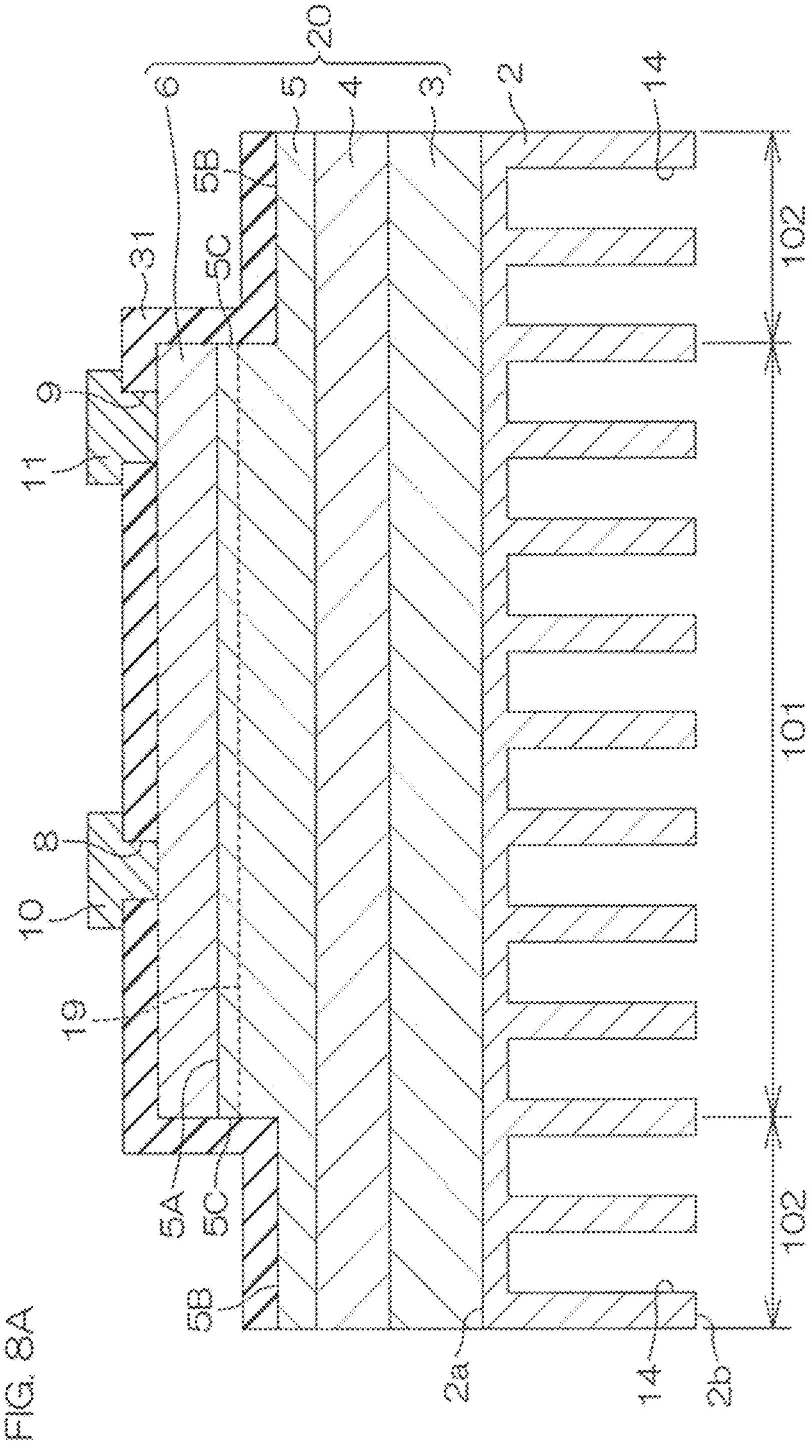
FIG. 8A is a sectional view showing an example of a manufacturing process of the nitride semiconductor device.

When the step shown in FIG. 4E is completed, the plurality of trenches 14 that extend from the second main surface 2*b* toward the first main surface 2*a* and up to the intermediate thickness of the substrate 2 are formed in the substrate 2 in both regions of the active region 101 and the inactive region 102 by photolithography and etching as shown in FIG. 8A. As the etching, the Bosch process may be used. In this preferred embodiment, the plurality of trenches 14 are disposed in a matrix in plan view.

Figure 8B:
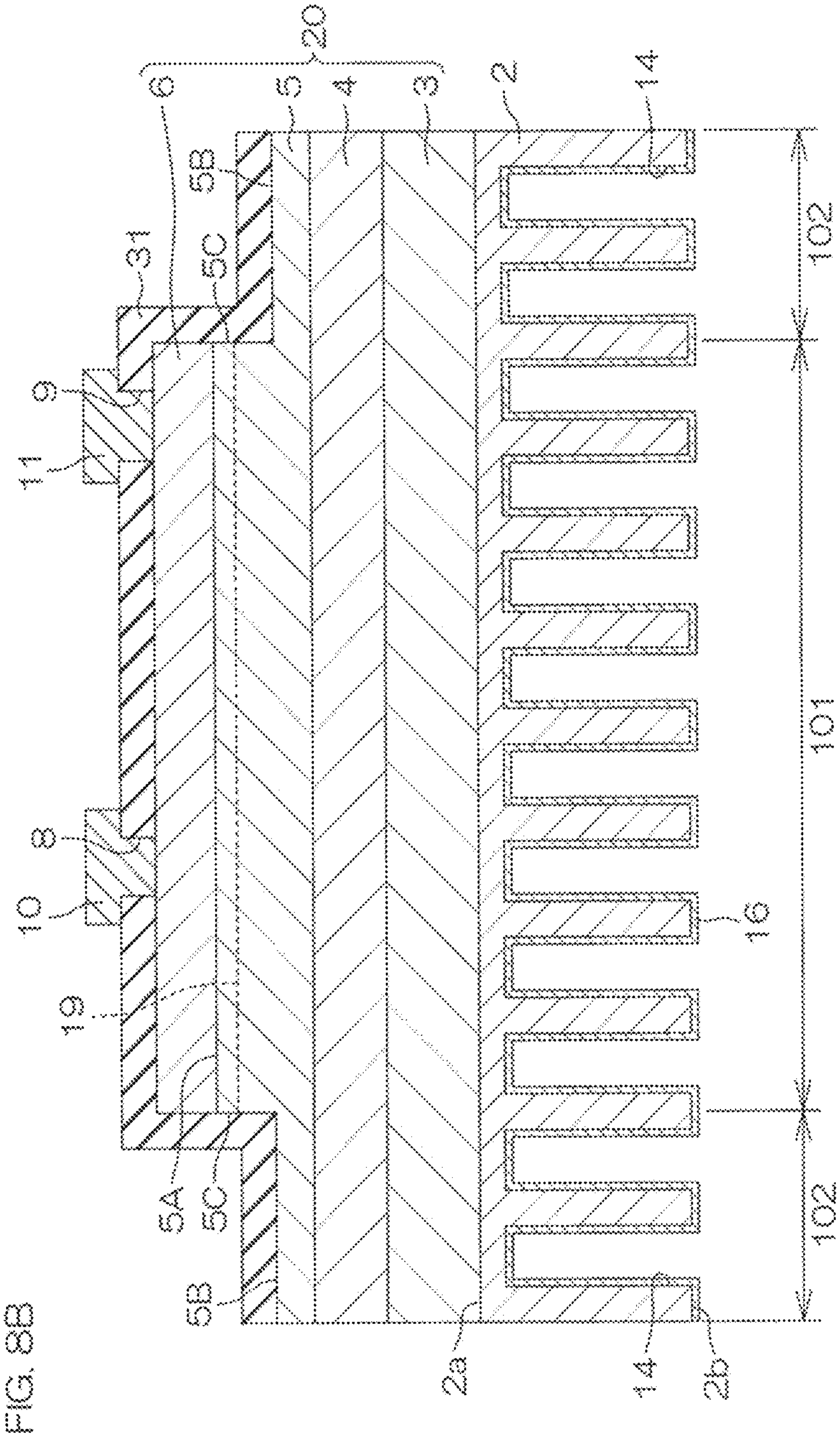
FIG. 8B is a sectional view showing a step subsequent to that of FIG. 8A.

Next, as shown in FIG. 8B, the barrier metal film 16 that is constituted, for example, of a TiN layer is formed on the inner surfaces (side surfaces and bottom surfaces) of the trenches 14 and the second main surface 2*b* of the substrate 2, for example, by a sputtering method.

Figure 8C:
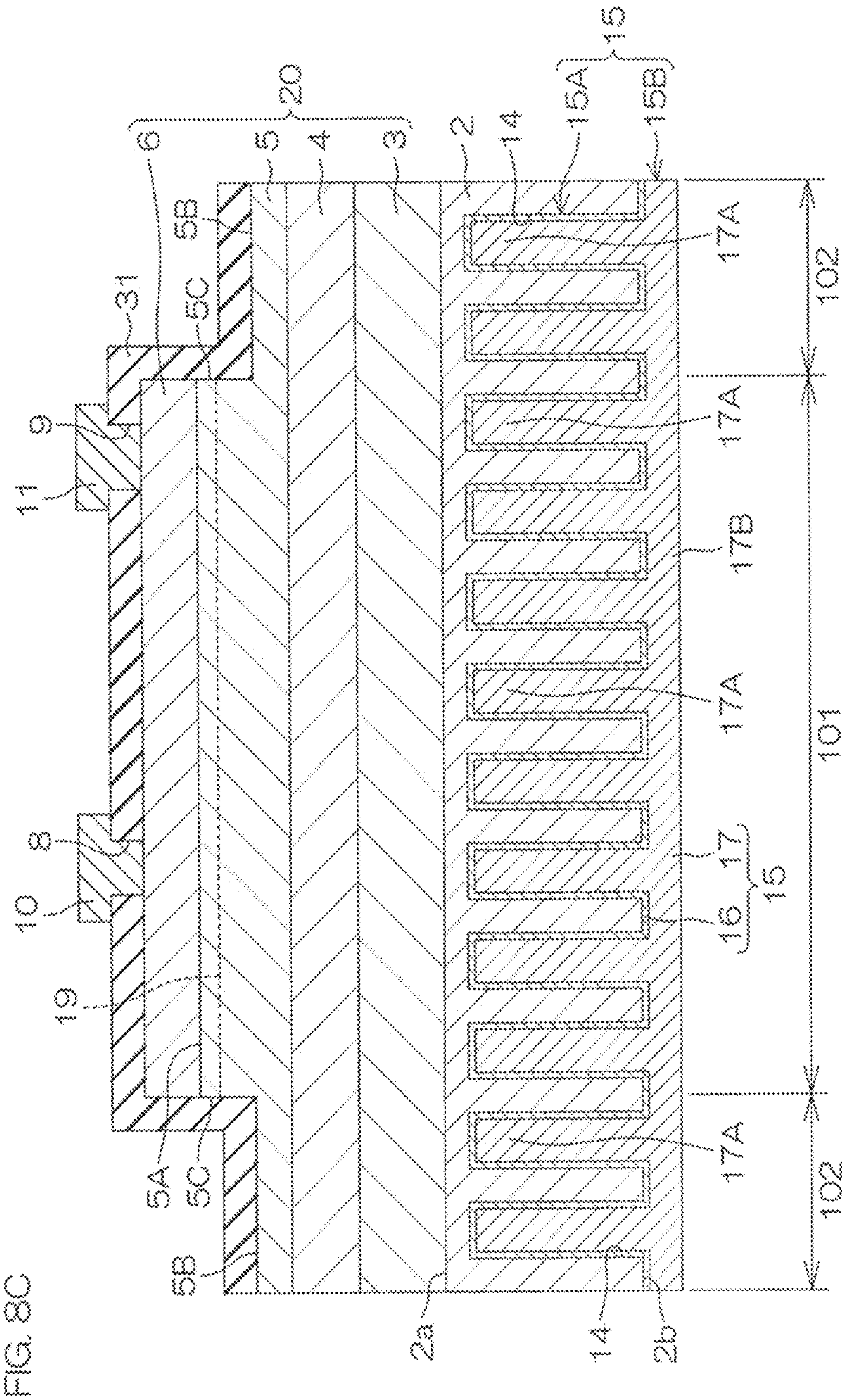
FIG. 8C is a sectional view showing a step subsequent to that of FIG. 8B.

Next, as shown in FIG. 8C, a film, for example, of gold (Au) is formed on the barrier metal film 16, for example by a plating method. Gold (Au) that is the material of the heat dissipation metal 17 is thereby embedded inside the trenches 14. The heat dissipation metal 17 constituted of the embedded portions 17A and the lead-out portion 17B is thereby formed. The heat dissipation structure 15 that is constituted of the barrier metal film 16 and the heat dissipation metal 17 is thereby formed. In other words, the heat dissipation structure 15 that is constituted of the embedded metals 15A embedded inside the respective trenches 14 and the lead-out metal 15B formed on the second main surface 2*b* is obtained.

Figure 8D:
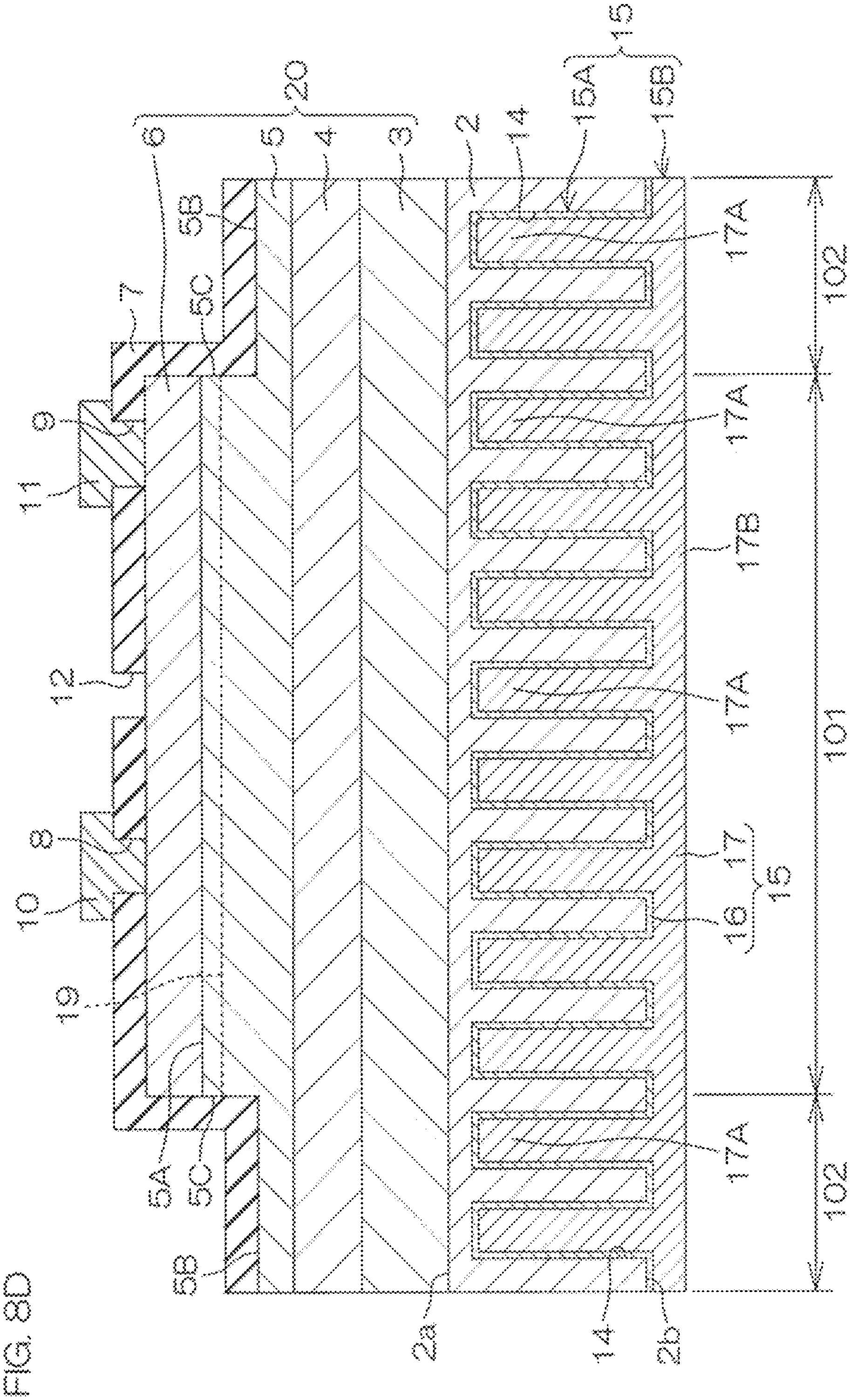
FIG. 8D is a sectional view showing a step subsequent to that of FIG. 8C.

Next, on the insulating material film 31, the source electrode 10, and the drain electrode 11, a resist film (not shown) is formed in the region excluding the region in which the gate contact hole 12 is to be formed. By the insulating material film 31 being dry etched via the resist film, the gate contact hole 12 is formed in the insulating material film 31 as shown in FIG. 8D. Thereby, the insulating material film 31 is patterned and the insulating film 7 is obtained. The gate contact hole 12 penetrates through the insulating film 7 and reaches the second nitride semiconductor layer 6. As the etching gas, for example, $CF_4$ gas is used.

Next, after removing the resist film, the gate electrode 13 is formed and the nitride semiconductor device 1A such as shown in FIG. 5 to FIG. 7 is thereby obtained. The gate electrode 13 is constituted, for example, of the Ni/Au laminated film in which the Ni film and the Au film are laminated in that order from the lower layer.

Figure 9:
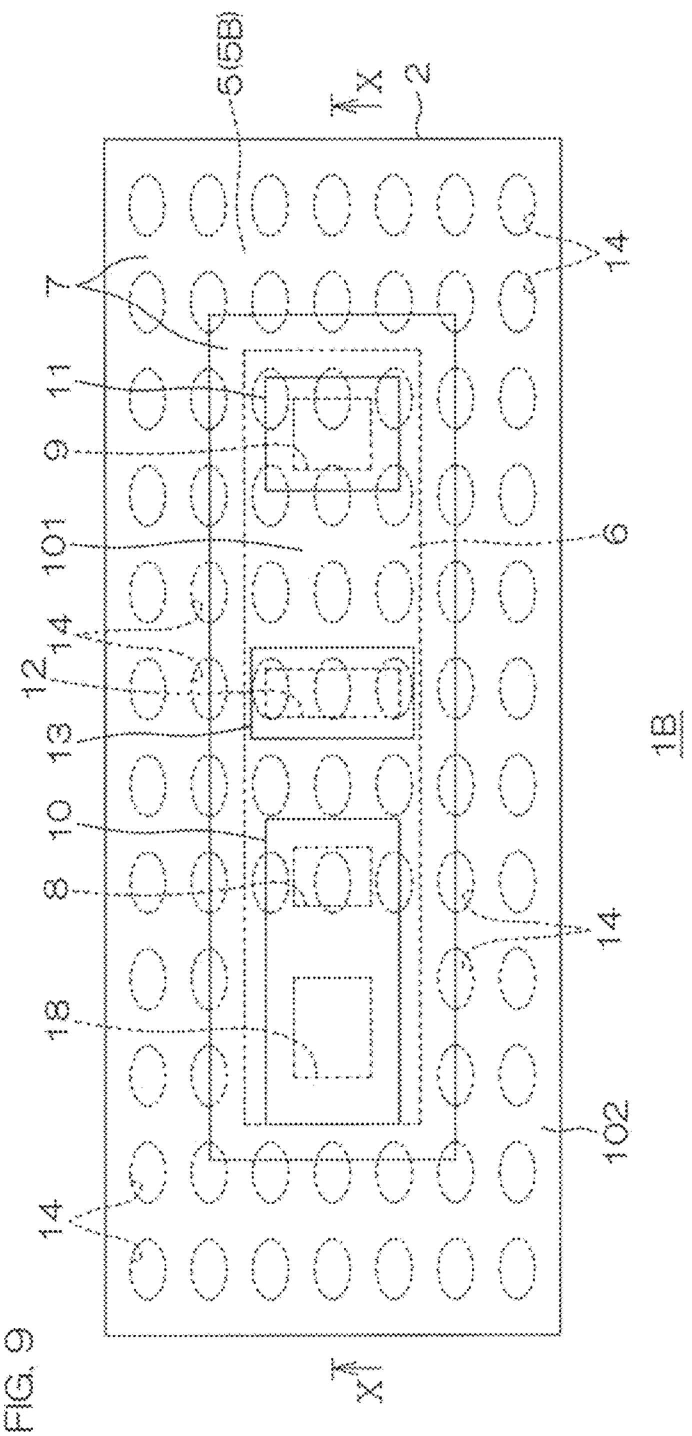
FIG. 9 is a plan view for describing the arrangement of a nitride semiconductor device according to a third preferred embodiment of the present disclosure.
Figure 10:
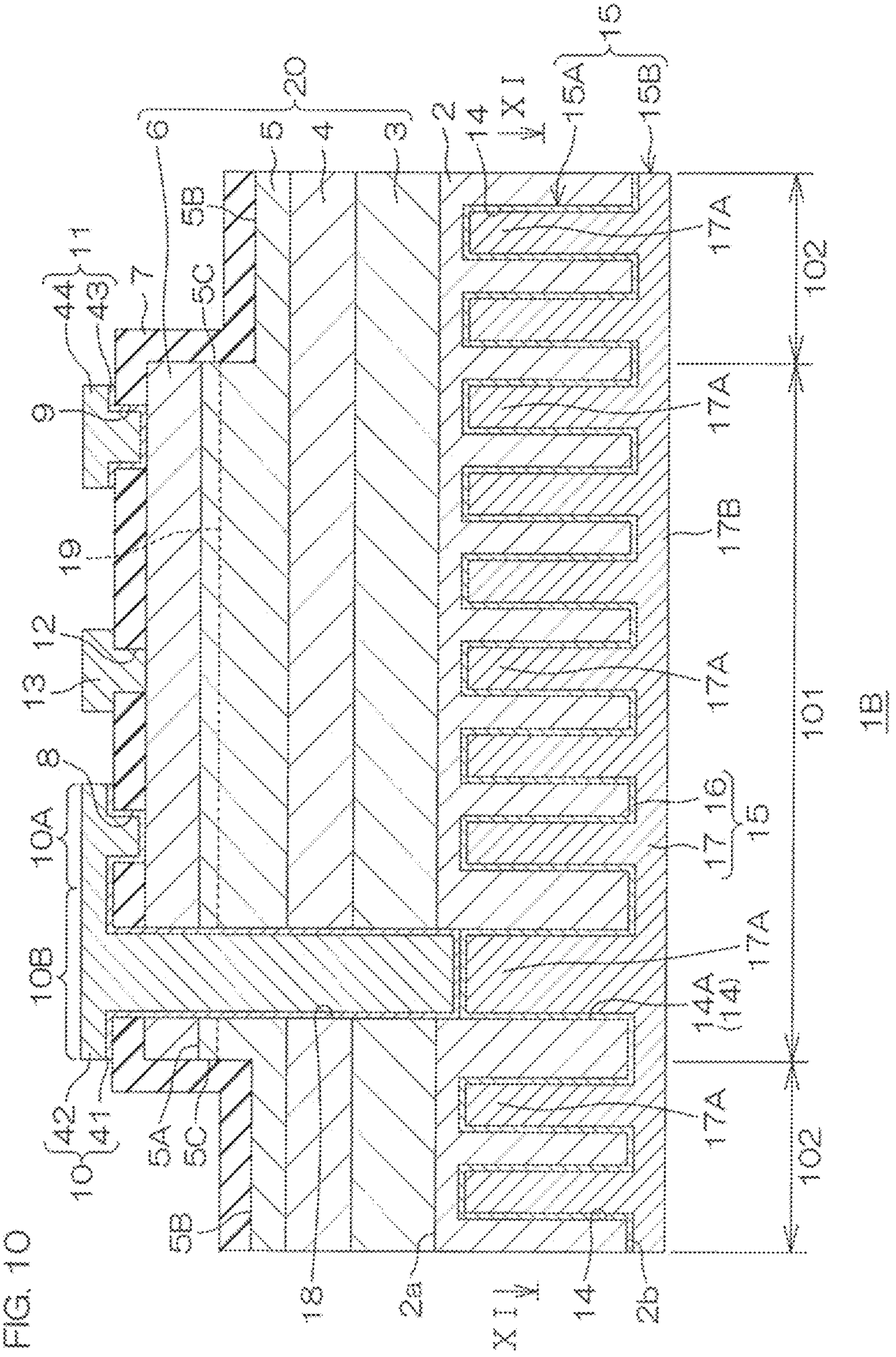
FIG. 10 is a sectional view taken along line X-X of FIG. 9.
Figure 11:
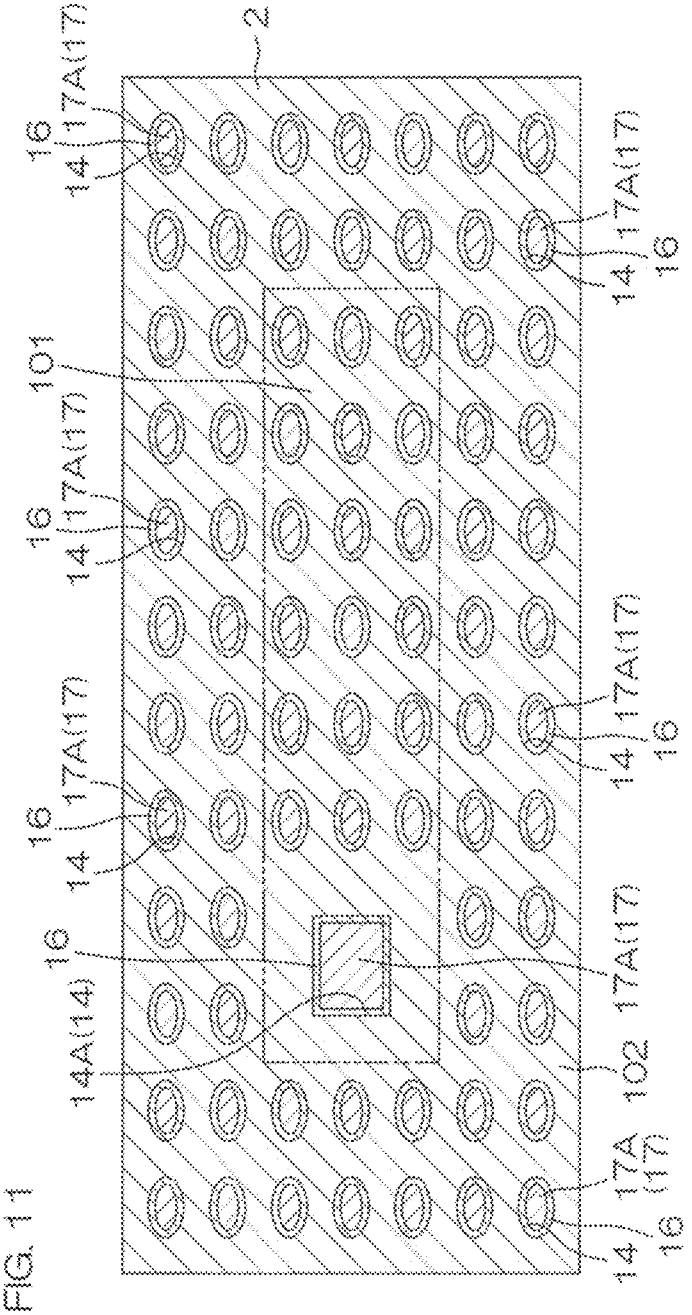
FIG. 11 is a sectional view taken along line XI-XI of FIG. 10.

FIG. 9 is a plan view for describing the arrangement of a nitride semiconductor device according to a third preferred embodiment of the present disclosure. FIG. 10 is a sectional view taken along line X-X of FIG. 9. FIG. 11 is a sectional view taken along line XI-XI of FIG. 10.

In FIG. 9, FIG. 10, and FIG. 11, portions corresponding to respective portions in FIG. 1, FIG. 2, and FIG. 3 described above are indicated with the same reference signs attached as in FIG. 1, FIG. 2, and FIG. 3.

In the following, a right/left direction of the sheet surface of FIG. 9 shall be referred to as a lateral direction and an up/down direction of the sheet surface of FIG. 9 shall be referred to as a vertical direction in some cases.

A nitride semiconductor device 1B according to the third preferred embodiment differs from the nitride semiconductor device 1 according to the first preferred embodiment in the arrangement of the source electrode 10 and the drain electrode 11 and in that the trenches 14 are formed in the substrate 2 not just in the inactive region 102 but also in the active region 101.

In the substrate 2, the nitride epitaxial layer 20, and the insulating film 7, a back contact hole 18 penetrating continuously through the insulating film 7 and the nitride epitaxial layer 20 from a front surface of the insulating film 7 and extending to an intermediate thickness of the substrate 2 is formed at an opposite side to the gate contact hole 12 with respect to the source contact hole 8.

The source electrode 10 includes a main electrode portion 10A and an extension portion 10B. The main electrode portion 10A covers the source contact hole 8 and the peripheral edge portion of the source contact hole 8 at the insulating film 7 front surface. A portion of the main electrode portion 10A enters into the source contact hole 8 and contacts the front surface of the second nitride semiconductor layer 6 inside the source contact hole 8.

The extension portion 10B covers the back contact hole 18 and a peripheral edge portion of the back contact hole 18 at the insulating film 7 front surface. A side edge of the extension portion 10B at the main electrode portion 10A side and a side edge of the main electrode portion 10A at the extension portion 10B side are connected. A portion of the extension portion 10B enters into the back contact hole 18 and contacts the substrate 2 inside the back contact hole 18. The extension portion 10B is an example of a "conductive member that electrically connects the source electrode and the embedded metal" in the present disclosure.

The source electrode 10 is constituted of a barrier metal film 41 and an electrode metal 42 formed on the barrier metal film 41. The barrier metal film 41 covers inner surfaces (side surfaces and bottom surface) of the source contact hole 8, the peripheral edge portion of the source contact hole 8 at the insulating film 7 front surface, inner surfaces of the back contact hole 18, and the peripheral edge portion of the back contact hole 18 at the insulating film 7 front surface. The barrier metal film 41 is constituted, for example, of a TiN film. The electrode metal 42 is constituted, for example, of Au. The electrode metal 42 may instead be constituted of Cu.

The drain electrode 11 covers the drain contact hole 9 and the peripheral edge portion of the drain contact hole 9 at the insulating film 7 front surface. A portion of the drain electrode 11 enters into the drain contact hole 9 and contacts the front surface of the second nitride semiconductor layer 6 inside the drain contact hole 9.

The drain electrode 11 is constituted of a barrier metal film 43 that covers the drain contact hole 9 and the peripheral edge portion of the drain contact hole 9 at the insulating film 7 front surface and an electrode metal 44 formed on the barrier metal film 43. The barrier metal film 43 is constituted, for example, of a TiN film. The electrode metal 44 is constituted, for example, of Au. The electrode metal 44 may instead be constituted of Cu.

A plurality of the trenches 14 are formed in the substrate 2 in the active region 101 and the inactive region 102. The plurality of trenches 14 include a contact trench 14A that reaches the barrier metal film 41 formed on a bottom surface of the back contact hole 18. The plurality of trenches 14 excluding the contact trench 14A are disposed in a matrix in plan view. These plurality of trenches 14 may instead be disposed in a staggered arrangement in plan view.

The barrier metal film 16 is formed on the inner surfaces of the plurality of trenches 14 including the contact trench 14A. Also, inside the trenches 14, the heat dissipation metal 17 is embedded in the state of being surrounded by the barrier metal film 16.

The heat dissipation metal 17 is constituted of a metal of high thermal conductivity and electrical conductivity such as gold (Au), copper (Cu), etc. In this preferred embodiment, the heat dissipation metal 17 is constituted of gold (Au). The heat dissipation metal 17 includes the embedded portions 17A inside the trenches 14 and the lead-out portion 17B that, outside the trenches 14, is led out along the second main surface 2*b* of the substrate 2 from the opening ends of the trenches 14. The lead-out portion 17B is led out uniformly from the respective trenches 14 and covers the entire area of the second main surface 2*b* of the substrate 2. The rear surface of the heat dissipation metal 17 (rear surface of the lead-out portion 17B) is formed to a flat shape across its entirety.

The embedded metals 15A of the present disclosure are constituted of the barrier metal film 16 inside the trenches 14 (including the contact trench 14A) and the embedded portions 17A that are surrounded by the barrier metal film 16. The lead-out metal 15B of the present disclosure is constituted of the barrier metal film 16 formed on the second main surface 2*b* of the substrate 2 and the lead-out portion 17B. The heat dissipation structure 15 is constituted of the embedded metals 15A inside all of the trenches 14 and the lead-out metal 15B. In other words, the heat dissipation structure 15 is constituted of the barrier metal film 16 and the heat dissipation metal 17 that are formed in the active region 101 and the inactive region 102.

Even in the third preferred embodiment, the heat dissipation can be enhanced because the embedded metals 15A are provided. Also, the heat dissipation can be enhanced further because the lead-out metal 15B is provided. With the third preferred embodiment, since the plurality of trenches 14 are formed not just in the inactive region 102 but also in the active region 101 and the heat dissipation metal 17 is embedded inside the plurality of trenches 14 with the barrier metal film 16 interposed therebetween, the heat dissipation can be enhanced more in comparison to the first preferred embodiment.

Also, with the third preferred embodiment, the main electrode portion 10A of the source electrode 10 is electrically connected to the lead-out metal 15B via the extension portion 10B and the embedded metal 15A inside the contact trench 14A. It is thus made possible to use the lead-out metal 15B as a back electrode of the source electrode 10.

FIG. 12A to FIG. 12H are sectional views for describing an example of a manufacturing process of the nitride semiconductor device 1B described above and show a sectional structure in a plurality of stages of the manufacturing process.

Even in manufacturing the nitride semiconductor device 1B shown in FIG. 9 to FIG. 11, the steps shown in FIG. 4A to FIG. 4C are carried out as in manufacturing the nitride semiconductor device 1 shown in FIG. 1 to FIG. 3.

Figure 12A:
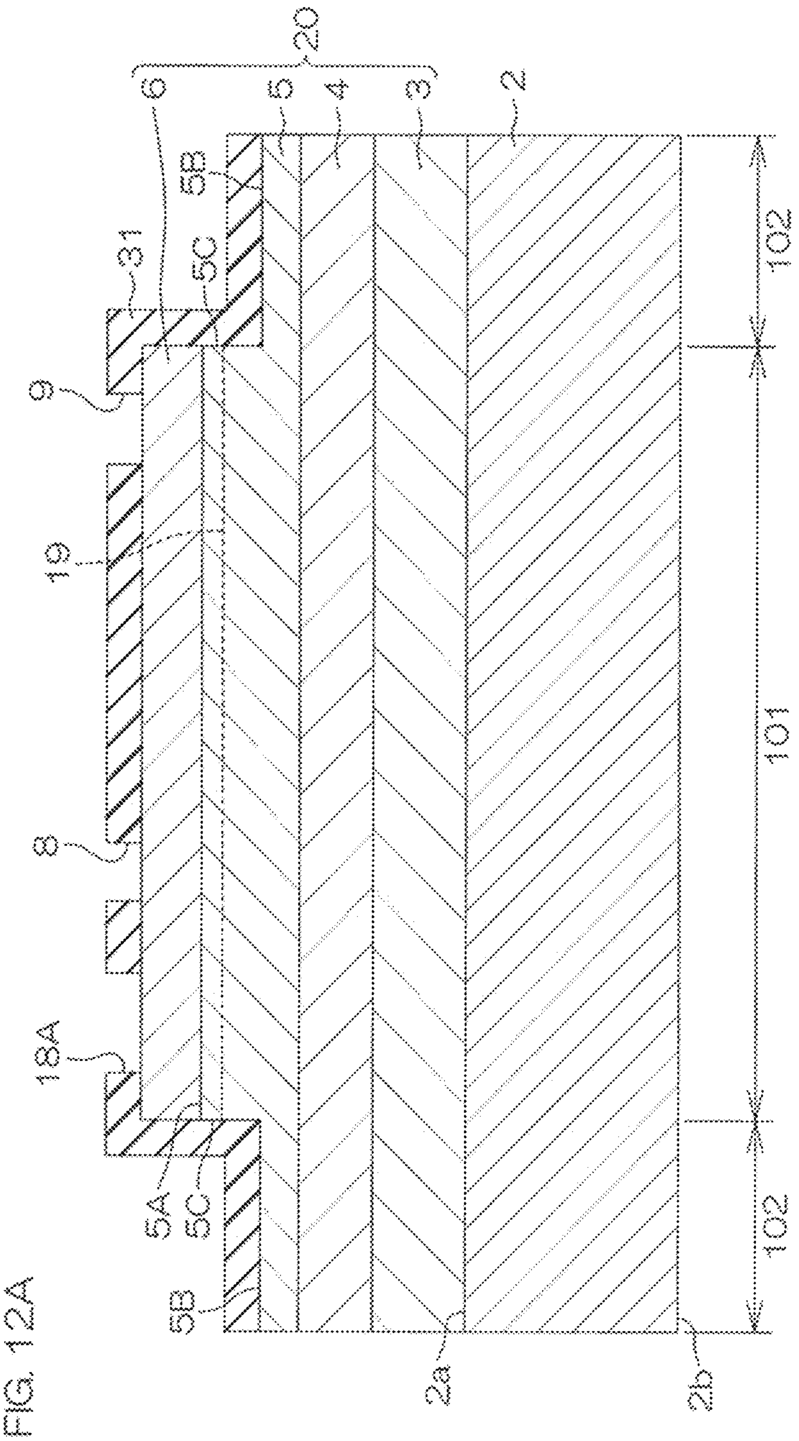
FIG. 12A is a sectional view showing an example of a manufacturing process of the nitride semiconductor device.

When the step shown in FIG. 4C is completed, a resist film (not shown) is formed in a region excluding regions in which the back contact hole 18, the source contact hole 8, and the drain contact hole 9 are to be formed. By the insulating material film 31 being dry etched via the resist film, one portion 18A of the back contact hole 18, the source contact hole 8, and the drain contact hole 9 are formed in the insulating material film 31 as shown in FIG. 12A.

The one portion 18A of the back contact hole 18, source contact hole 8, and the drain contact hole 9 penetrate through the insulating material film 31 and reach the second nitride semiconductor layer 6. A width of each of the one portion 18A of the back contact hole 18, the source contact hole 8, and the drain contact hole 9 is approximately 3 to 5 μm. As the etching gas, for example, $CF_4$ gas is used. Thereafter, the resist film is removed.

Figure 12B:
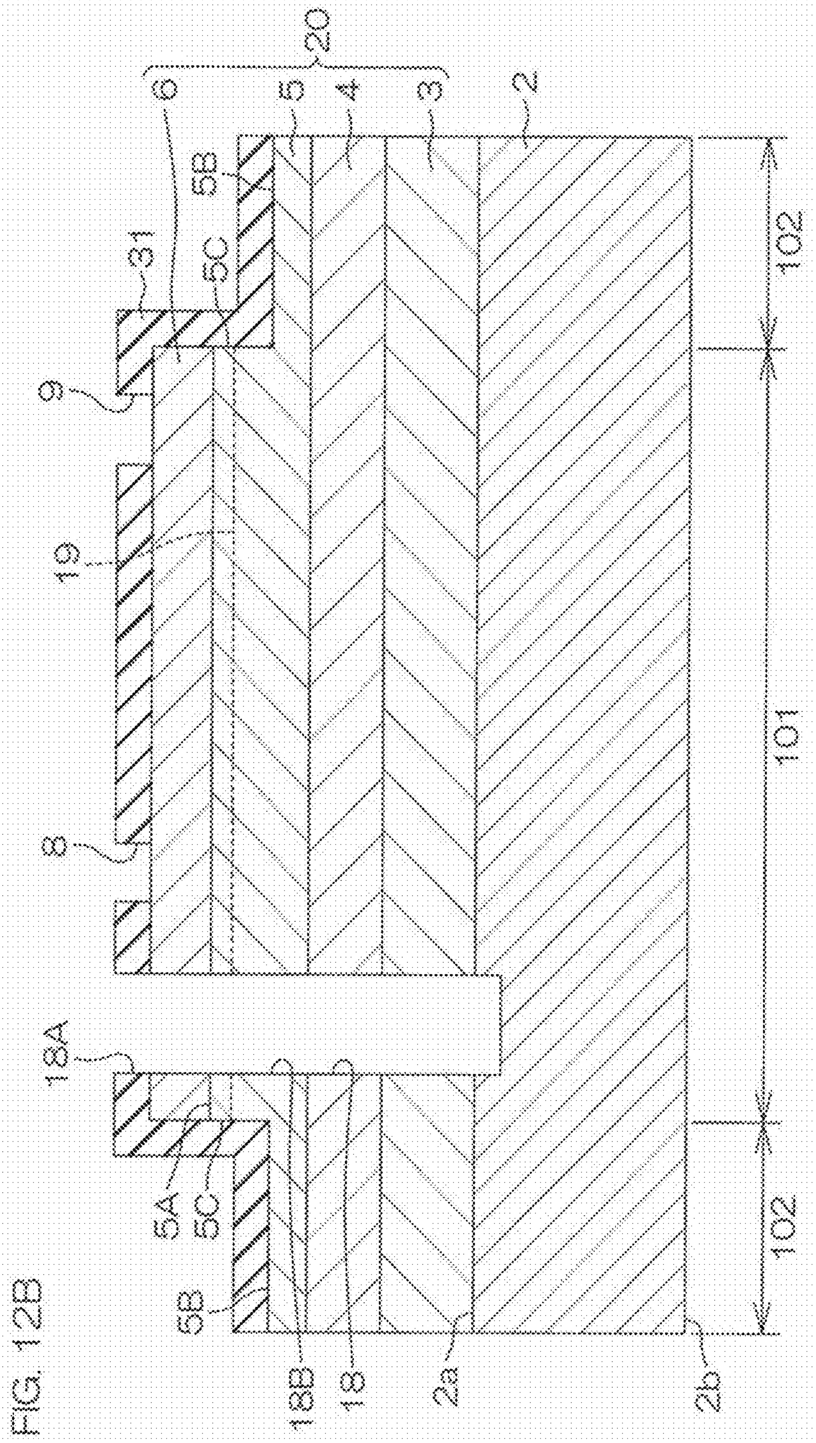
FIG. 12B is a sectional view showing a step subsequent to that of FIG. 12A.

Next, a resist film (not shown) is formed on the insulating material film 31 in a region excluding the region in which the back contact hole 18 is to be formed. Portions of the nitride epitaxial layer 20 and the substrate 2 are etched via the resist film. Thereby, a hole 18B that penetrates through the nitride epitaxial layer 20 and reaches an interior of the substrate 2, that is, the remaining portion 18B of the back contact hole 18 is formed as shown in FIG. 12B. The back contact hole 18 constituted of the one portion 18A and the remaining portion 18B is thereby obtained. Thereafter, the resist film is removed.

Figure 12C:
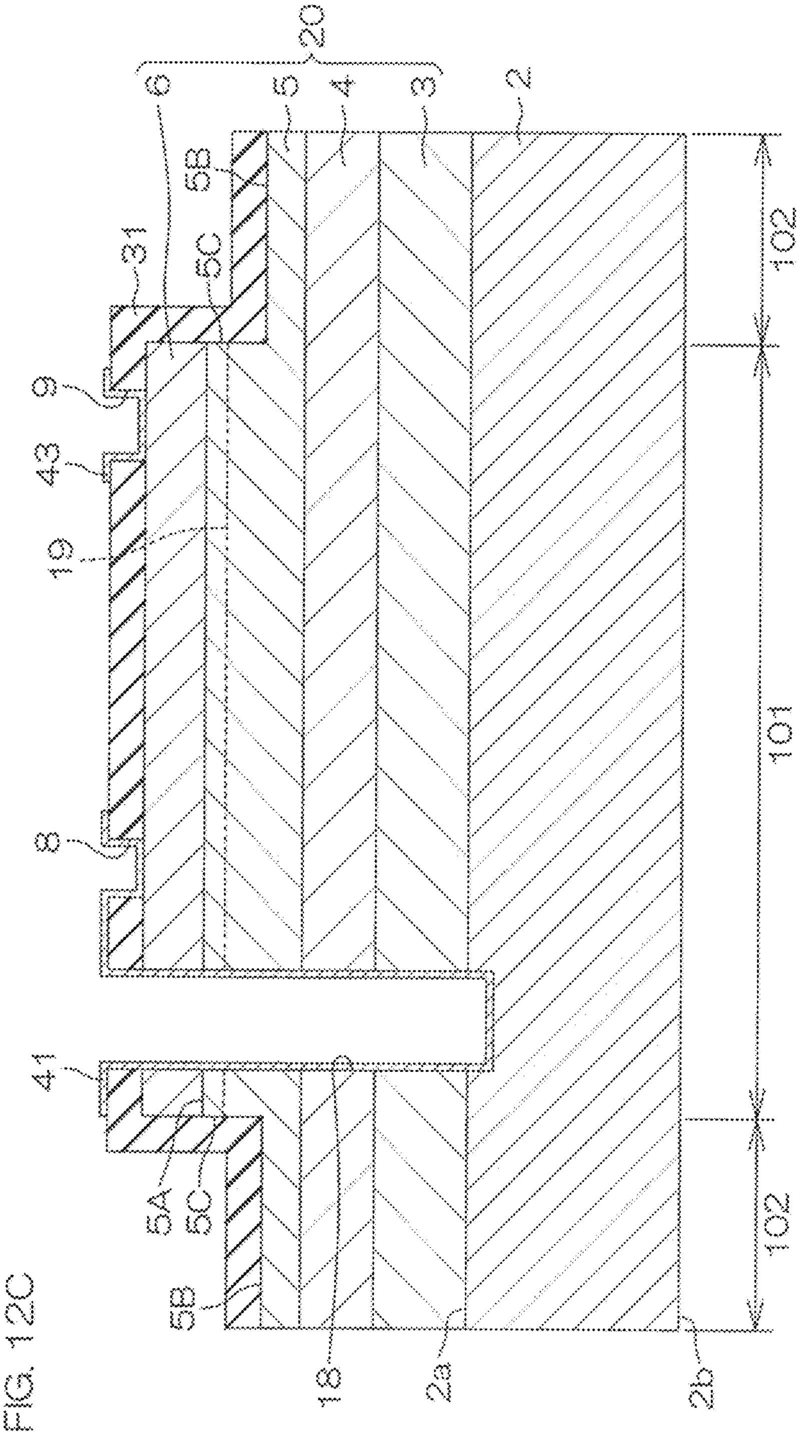
FIG. 12C is a sectional view showing a step subsequent to that of FIG. 12B.

Next, for example, by a sputtering method, a barrier metal material film (for example, a TiN film) that is a material film of the barrier metal films 41 and 43 is formed on the front surface of the insulating material film 31, the inner surfaces (side surfaces and bottom surface) of the back contact hole 18, the inner surfaces of the source contact hole 8, and inner surfaces of the drain contact hole 9. The barrier metal films 41 and 43 are then formed as shown in FIG. 12C by the barrier material film being patterned.

Figure 12D:
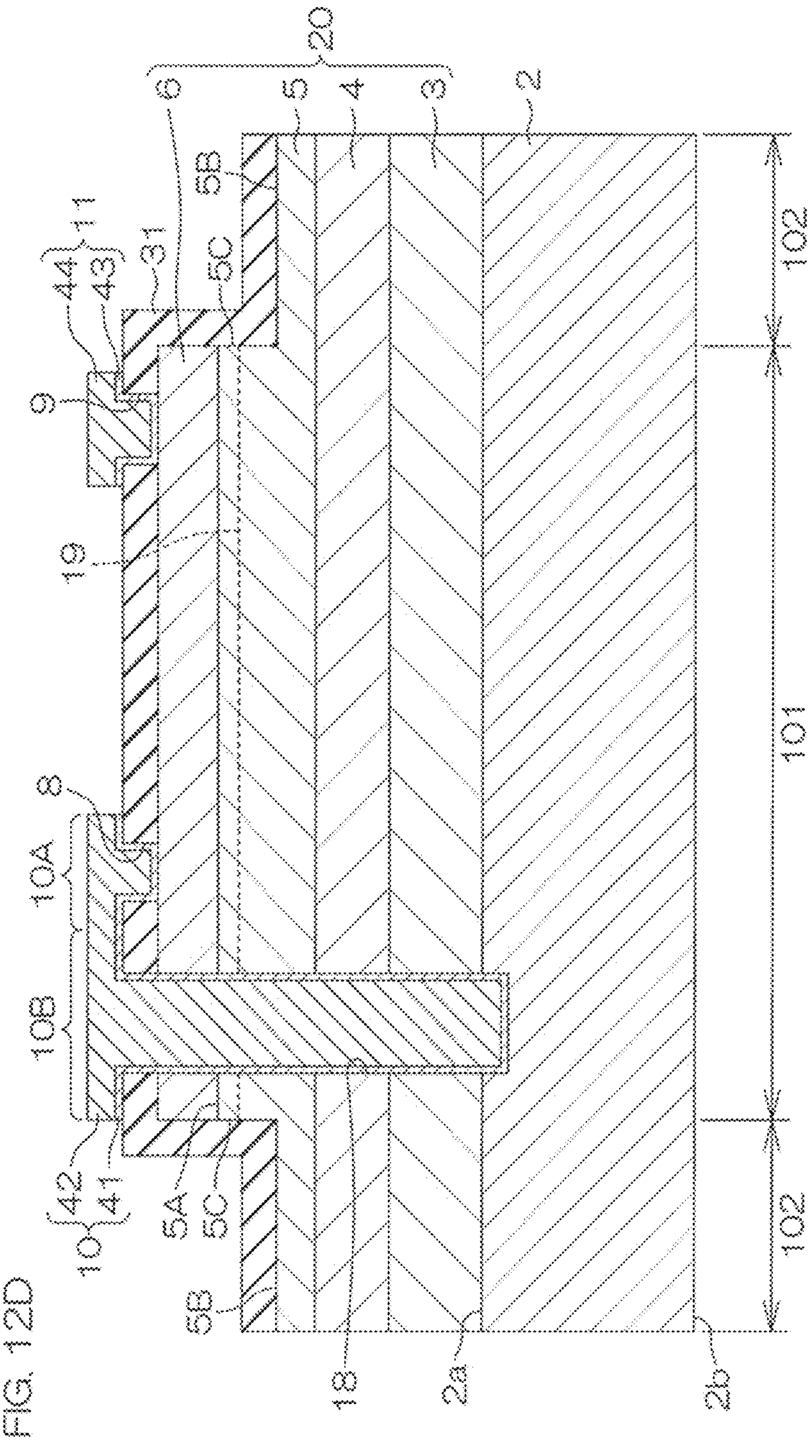
FIG. 12D is a sectional view showing a step subsequent to that of FIG. 12C.

Next, as shown in FIG. 12D, for example, by a plating method, the electrode metal 42 constituted, for example, of Au is formed on the barrier metal 41 and the electrode metal 44 constituted, for example, of Au is formed on the barrier metal 43. The source electrode 10 constituted of the barrier metal film 41 and the electrode metal 42 and the drain electrode 11 constituted of the barrier metal film 43 and the electrode metal 44 are thereby obtained. The source electrode 10 includes the main electrode portion 10A and the extension portion 10B.

Figure 12E:
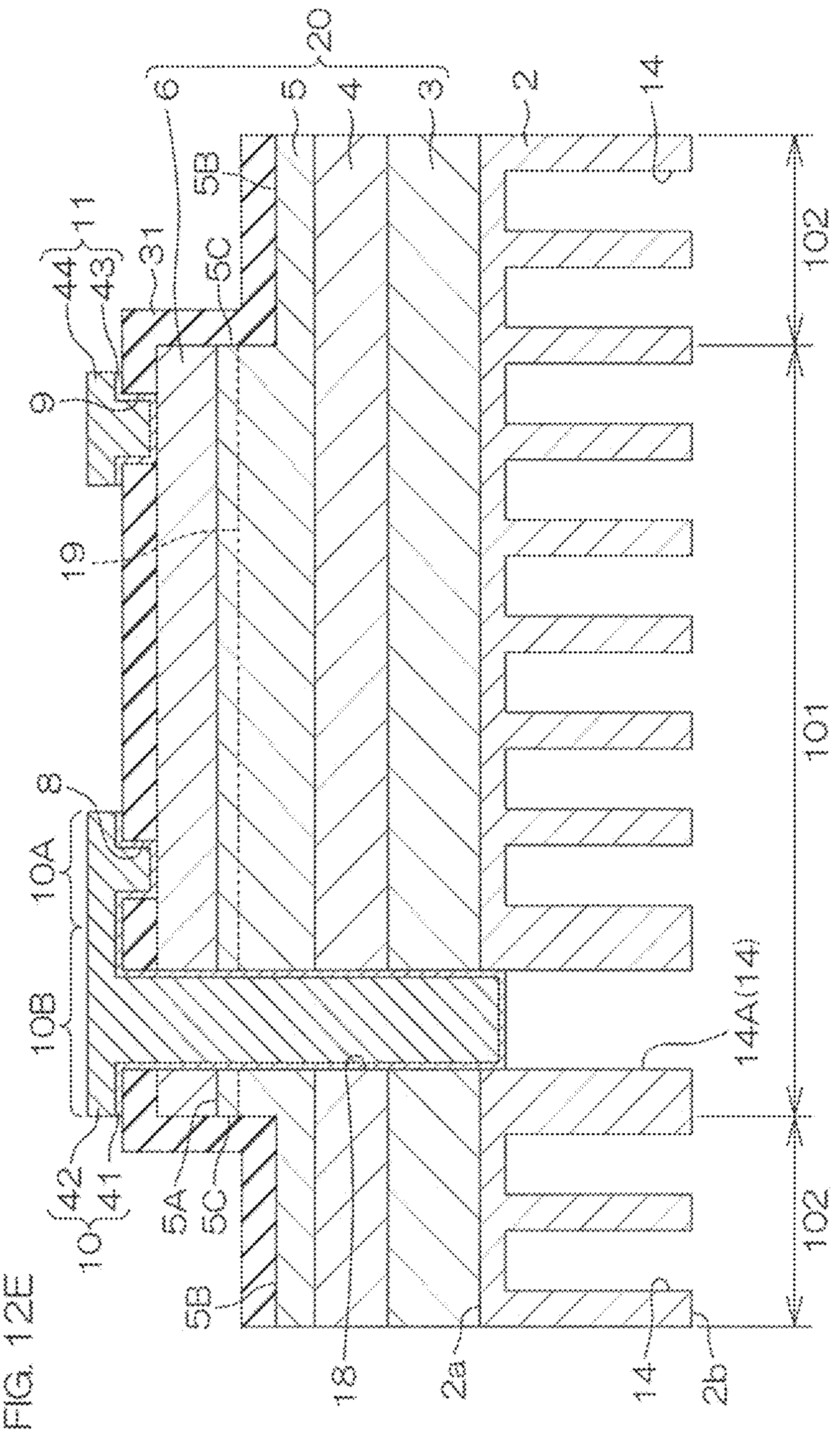
FIG. 12E is a sectional view showing a step subsequent to that of FIG. 12D.

Next, the plurality of trenches 14 that extend from the second main surface 2*b* toward the first main surface 2*a* and up to the intermediate thickness of the substrate 2 are formed in the substrate 2 in both regions of the active region 101 and the inactive region 102 by photolithography and etching as shown in FIG. 12E. The plurality of trenches 14 include the contact trench 14A that reaches, from the second main surface 2*b* of the substrate 2, a lower surface of the barrier metal film 41 formed on the bottom surface of the back contact hole 18. As the etching, the Bosch process may be used. In this preferred embodiment, the plurality of trenches 14 excluding the contact trench 14 are disposed in a matrix in plan view.

Figure 12F:
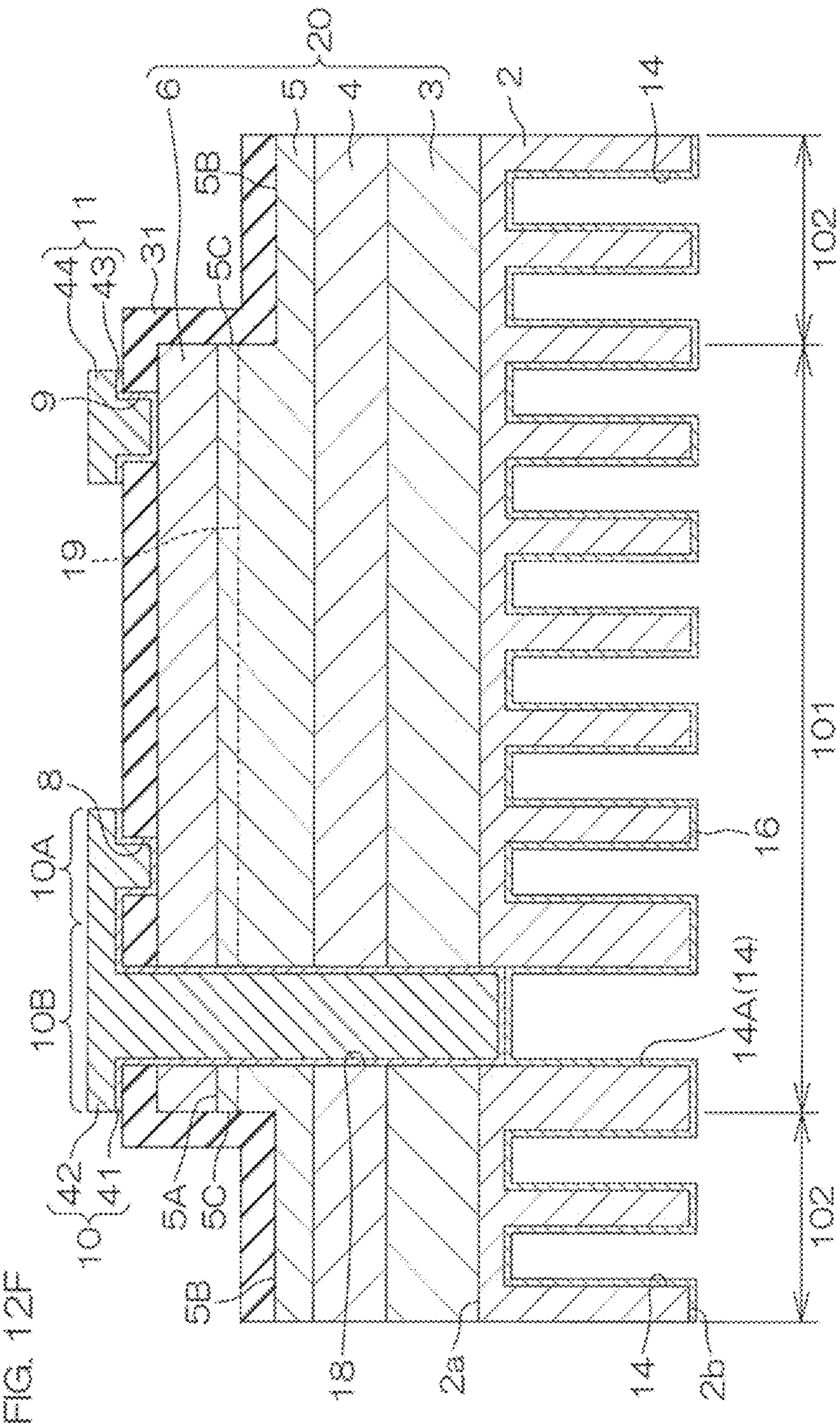
FIG. 12F is a sectional view showing a step subsequent to that of FIG. 12E.

Next, as shown in FIG. 12F, the barrier metal film 16 that is constituted, for example, of a TiN layer is formed on the inner surfaces (side surfaces and bottom surfaces) of the trenches 14 and the second main surface 2*b* of the substrate 2, for example, by a sputtering method.

Figure 12G:
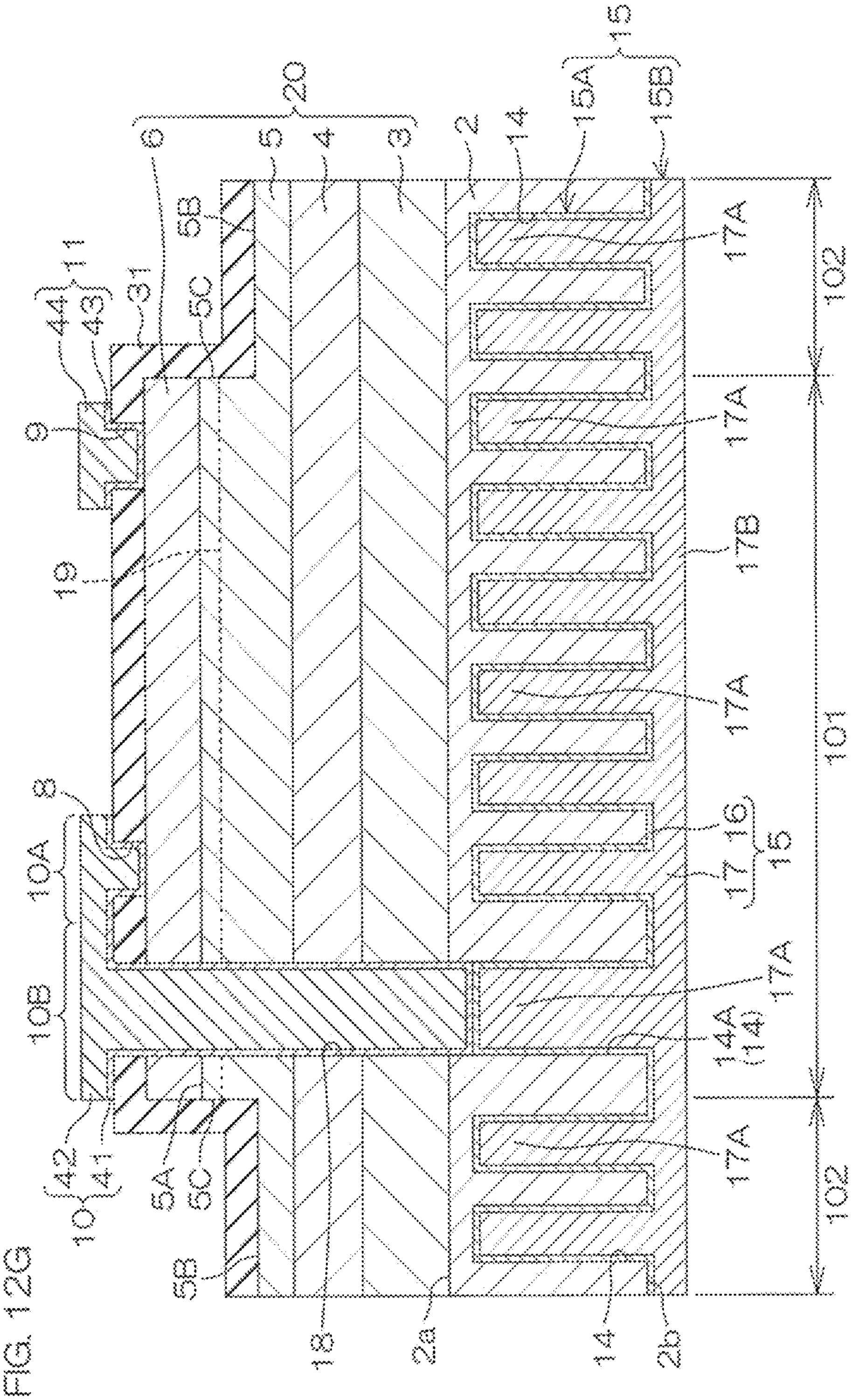
FIG. 12G is a sectional view showing a step subsequent to that of FIG. 12F.

Next, as shown in FIG. 12G, a film, for example, of gold (Au) is formed on the barrier metal film 16, for example by a plating method. Gold (Au) that is the material of the heat dissipation metal 17 is thereby embedded inside the trenches 14. The heat dissipation metal 17 constituted of the embedded portions 17A and the lead-out portion 17B is thereby formed. The heat dissipation structure 15 that is constituted of the barrier metal film 16 and the heat dissipation metal 17 is thereby formed.

In other words, the heat dissipation structure 15 that is constituted of the embedded metals 15A embedded inside the respective trenches 14 and the lead-out metal 15B formed on the second main surface 2*b* is obtained. Also, the source electrode 10 is electrically connected to the lead-out metal 15B via the extension portion 10B and the embedded metal 15A inside the contact trench 14.

Figure 12H:
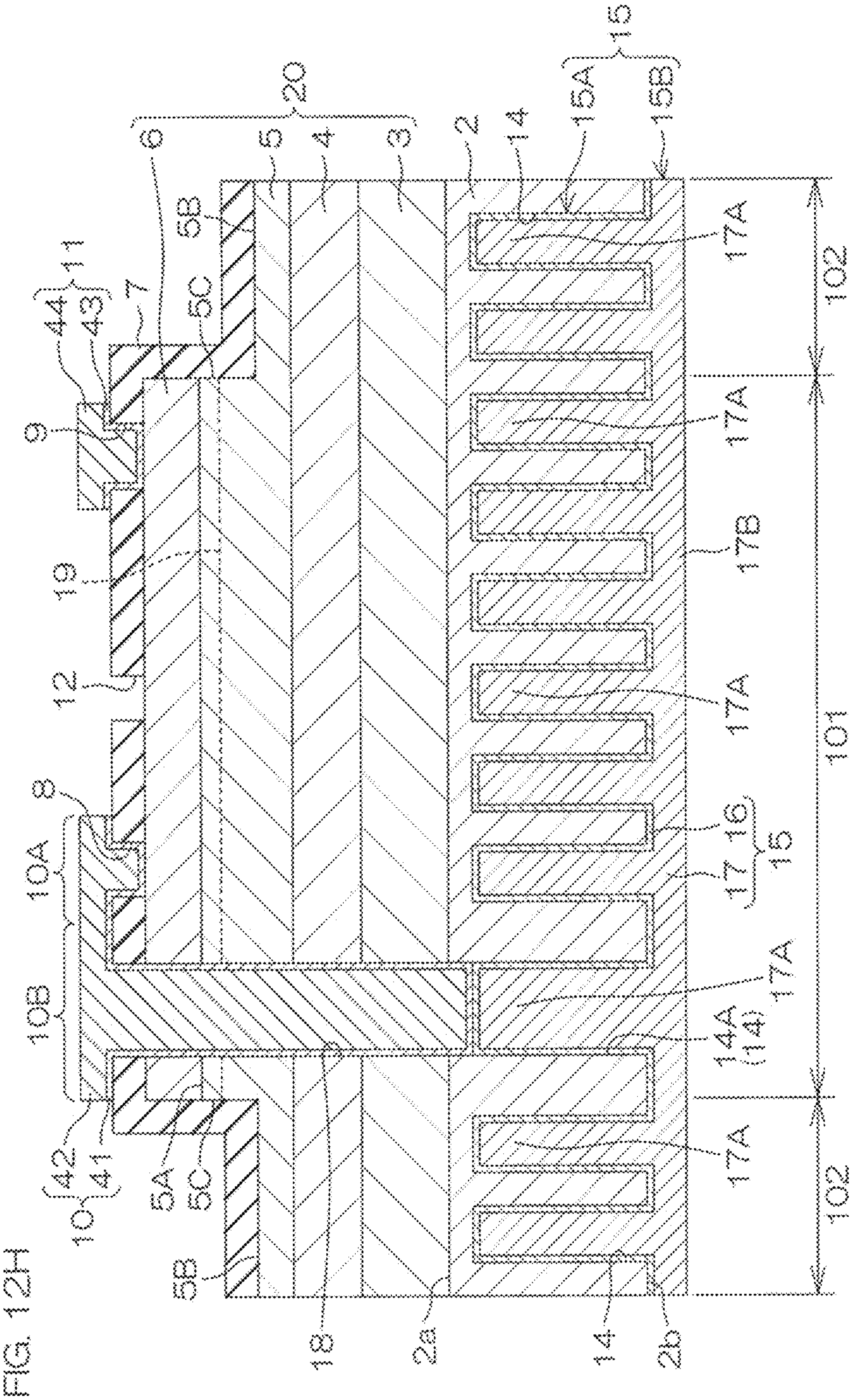
FIG. 12H is a sectional view showing a step subsequent to that of FIG. 12G.

Next, on the insulating material film 31, the source electrode 10, and the drain electrode 11, a resist film (not shown) is formed in the region excluding the region in which the gate contact hole 12 is to be formed. By the insulating material film 31 being dry etched via the resist film, the gate contact hole 12 is formed in the insulating material film 31 as shown in FIG. 12H. Thereby, the insulating material film 31 is patterned and the insulating film 7 is obtained. The gate contact hole 12 penetrates through the insulating film 7 and reaches the second nitride semiconductor layer 6. As the etching gas, for example, $CF_4$ gas is used.

Next, after removing the resist film, the gate electrode 13 is formed and the nitride semiconductor device 1B such as shown in FIG. 9 to FIG. 11 is thereby obtained. The gate electrode 13 is constituted, for example, of the Ni/Au laminated film in which the Ni film and the Au film are laminated in that order from the lower layer.

Figure 13:
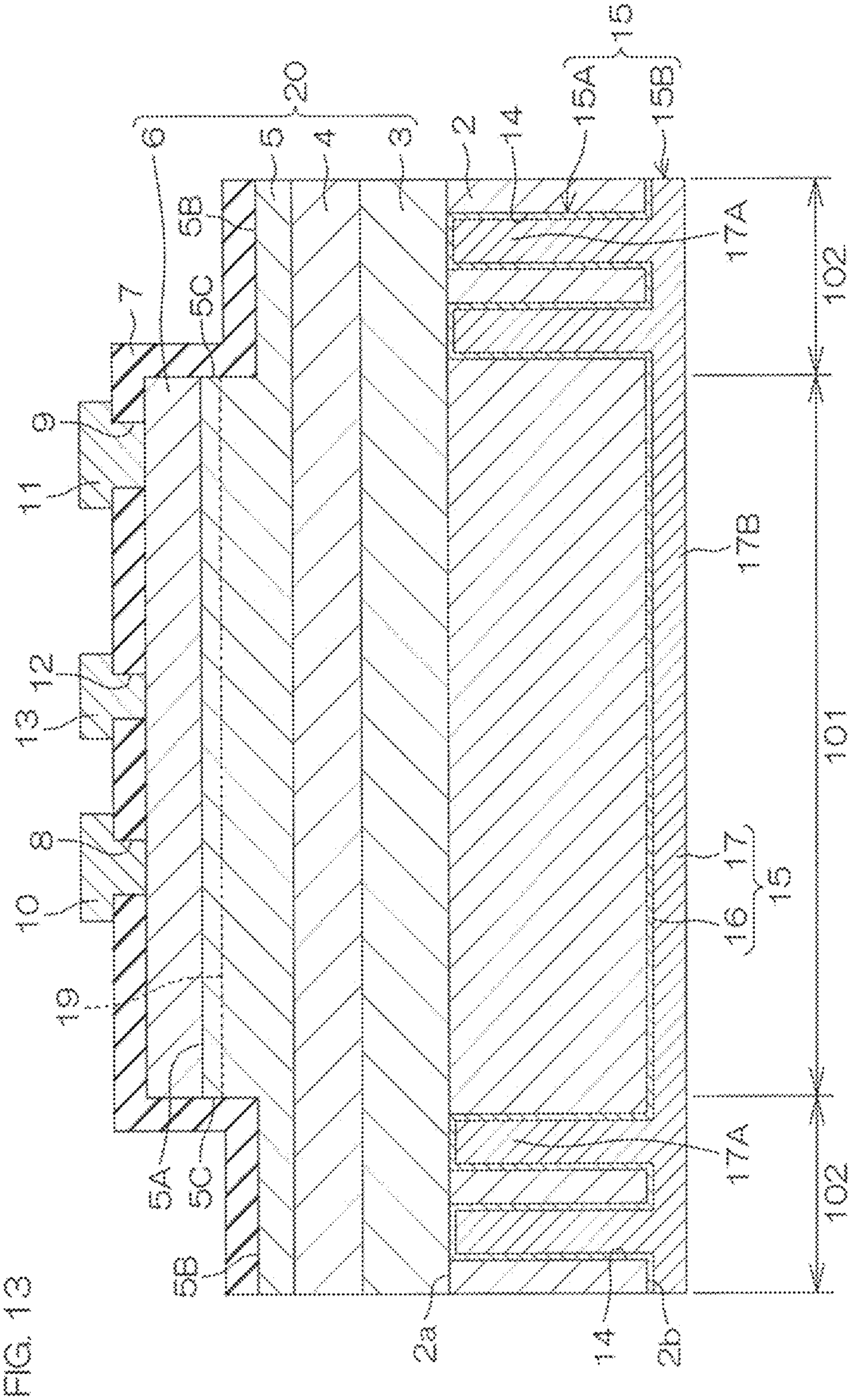
FIG. 13 is a sectional view showing a modification example of the nitride semiconductor device of FIG. 2.
Figure 14:
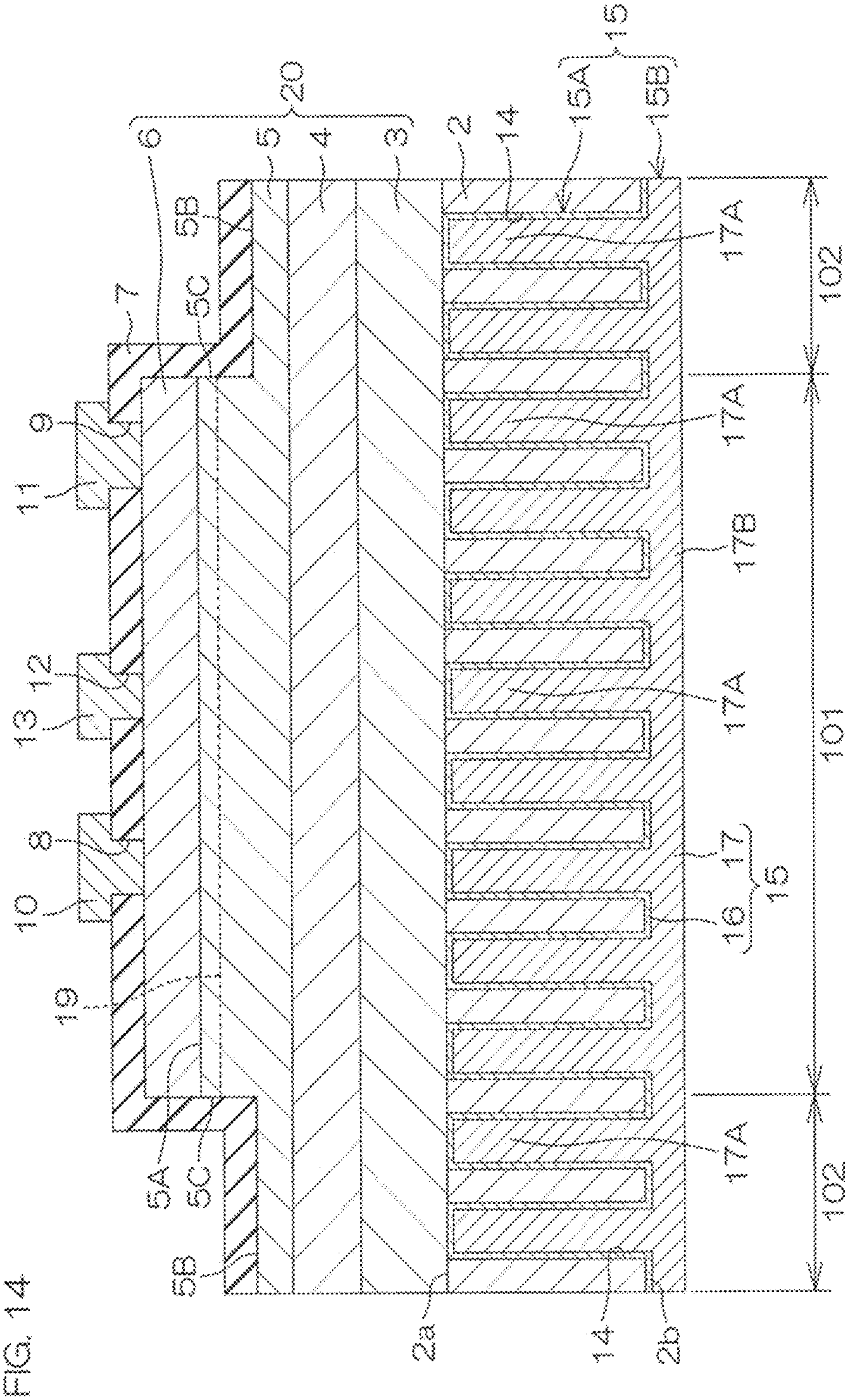
FIG. 14 is a sectional view showing a modification example of the nitride semiconductor device of FIG. 6.
Figure 15:
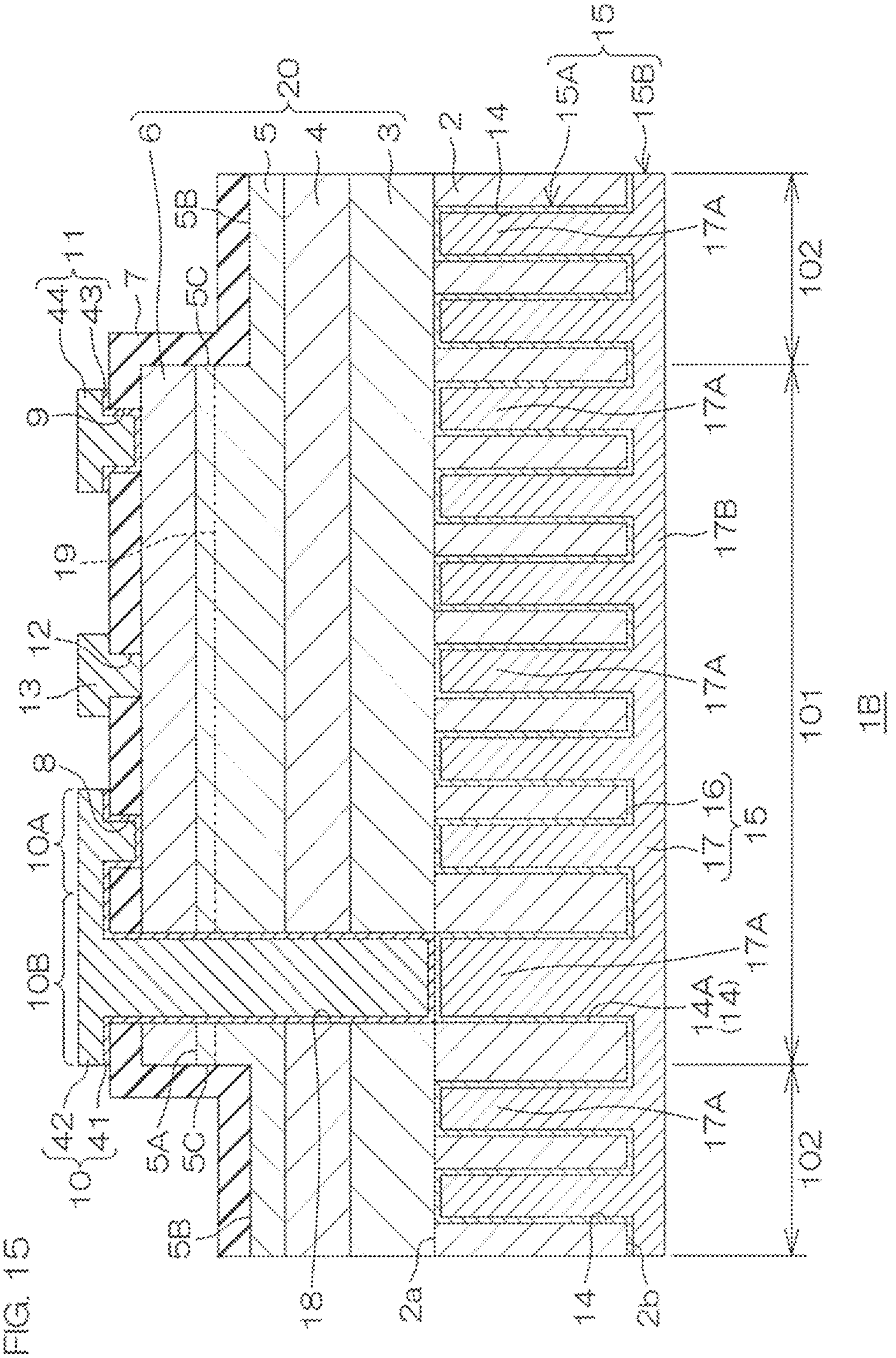
FIG. 15 is a sectional view showing a modification example of the nitride semiconductor device of FIG. 10.

FIG. 13, FIG. 14, and FIG. 15 are sectional views respectively showing modifications of the first, second, and third preferred embodiments and are sectional views corresponding to section planes of FIG. 2, FIG. 6, and FIG. 10. In FIG. 13, FIG. 14, and FIG. 15, portions corresponding to respective portions in FIG. 2, FIG. 6, and FIG. 10, respectively, are indicated with the same reference signs attached as in FIG. 2, FIG. 6, and FIG. 10.

With each of the first, second, and third preferred embodiments described above, the trenches 14 extend from the second main surface 2*b* toward the first main surface 2*a* and up to the intermediate thickness of the substrate 2. However, as shown in each of FIG. 13, FIG. 14, and FIG. 15, the trenches 14 may instead be formed such as to penetrate through the substrate 2 from the second main surface 2*b* toward the first main surface 2*a* and reach the buffer layer 3 (nitride epitaxial layer 20).

Also, although with each of the first to third preferred embodiments described above, the semi-insulating nitride layer 4 is formed on the buffer layer 3, the semi-insulating nitride layer 4 does not have to be formed.

Also, although with each of the first to third preferred embodiments described above, an example where the first nitride semiconductor layer (electron transit layer) 5 is constituted of a GaN layer and the second nitride semiconductor layer (electron supply layer) 6 is constituted of an AlGaN layer, it suffices that the first nitride semiconductor layer 5 and the second nitride semiconductor layer 6 differ in bandgap (for example, in Al composition) and other combinations are also possible. For example, as combinations of the first nitride semiconductor layer 5/second nitride semiconductor layer 6, GaN/AlN, AlGaN/AlN, etc., can be given as examples.

While preferred embodiments of the present disclosure were described in detail above, these are merely specific examples used to clarify the technical contents of the present disclosure and the present disclosure should not be interpreted as being limited to these specific examples, the scope of the present disclosure is limited only by the appended claims.

The present application corresponds to Japanese Patent Application No. 2021-053735 filed on Mar. 26, 2021 in the Japan Patent Office, and the entire disclosure of this application is incorporated herein by reference.

The invention claimed is:

1. A nitride semiconductor device comprising:

a substrate that has a first main surface and a second main surface at an opposite side thereto; and a nitride epitaxial layer that is formed on the first main surface; and wherein the nitride semiconductor device has, in plan view, an active region inside the nitride epitaxial layer in which a two-dimensional electron gas can form and an inactive region inside the nitride epitaxial layer in which the two-dimensional electron gas is not formed and comprises: a trench that, in at least the inactive region among the active region and the inactive region, is dug in from the second main surface of the substrate toward the first main surface of the substrate; and an embedded metal that is formed inside the trench, wherein the nitride epitaxial layer comprises a first nitride semiconductor layer that constitutes an electron transit layer, an upper surface of the first nitride semiconductor layer on the side opposite to the substrate has a high step portion and a low step portion defined by a step, and a region in which the high step portion is present in plan view is the active region, and a region in which the low step portion is present in plan view is the inactive region.

2. The nitride semiconductor device according to claim 1, wherein the trench is formed in just the inactive region among the active region and the inactive region.

3. The nitride semiconductor device according to claim 1, wherein the trench is formed in both the active region and the inactive region.

4. The nitride semiconductor device according to claim 1, wherein a total volume of the trench present inside the inactive region is not less than ⅓ of a volume of the substrate inside the inactive region.

5. The nitride semiconductor device according to claim 1, comprising: a lead-out metal that is formed on the second main surface and is thermally connected to the embedded metal.

6. The nitride semiconductor device according to claim 1, wherein the trench is dug in from the second main surface toward the first main surface and up to an intermediate portion of the substrate.

7. The nitride semiconductor device according to claim 1, wherein the trench penetrates through the substrate and reaches the nitride epitaxial layer.

8. The nitride semiconductor device according to claim 1, comprising: a source electrode; a drain electrode; and a gate electrode that are disposed on the nitride epitaxial layer; and a contact metal that penetrates through the nitride epitaxial layer and electrically connects the source electrode and the embedded metal.

9. The nitride semiconductor device according to claim 1, wherein the nitride epitaxial layer comprises:

a second nitride semiconductor layer that is formed on the first nitride semiconductor layer, constitutes an electron supply layer, and is higher in bandgap than the first nitride semiconductor layer.

10. The nitride semiconductor device according to claim 9, comprising: a semi-insulating nitride layer that is disposed between the substrate and the first nitride semiconductor layer and with which an acceptor concentration is higher than a donor concentration.

11. The nitride semiconductor device according to claim 10, comprising: a buffer layer that is disposed between the substrate and the semi-insulating nitride layer and is constituted of a nitride semiconductor.

12. The nitride semiconductor device according to claim 9, wherein the first nitride semiconductor layer is constituted of a GaN layer and the second nitride semiconductor layer is constituted of an AlGaN layer.

13. The nitride semiconductor device according to claim 10, wherein the first nitride semiconductor layer is constituted of a GaN layer, the second nitride semiconductor layer is constituted of an AlGaN layer, and the semi-insulating nitride layer is constituted of a GaN layer that contains carbon.

14. The nitride semiconductor device according to claim 11, wherein the first nitride semiconductor layer is constituted of a GaN layer, the second nitride semiconductor layer is constituted of an AlGaN layer, the semi-insulating nitride layer is constituted of a GaN layer that contains carbon, and the buffer layer is constituted of a laminated film of an AlN layer formed on the first main surface and an AlGaN layer that is laminated on the AlN layer.

15. The nitride semiconductor device according to claim 11, wherein the first nitride semiconductor layer is constituted of a GaN layer, the second nitride semiconductor layer is constituted of an AlGaN layer, the semi-insulating nitride layer is constituted of a GaN layer that contains carbon, and the buffer layer is constituted of an AlN layer or an AlGaN layer.

16. The nitride semiconductor device according to claim 2, wherein a total volume of the trench present inside the inactive region is not less than ⅓ of a volume of the substrate inside the inactive region.

17. The nitride semiconductor device according to claim 3, wherein a total volume of the trench present inside the inactive region is not less than ⅓ of a volume of the substrate inside the inactive region.

18. The nitride semiconductor device according to claim 2, comprising: a lead-out metal that is formed on the second main surface and is thermally connected to the embedded metal.

19. The nitride semiconductor device according to claim 3, comprising: a lead-out metal that is formed on the second main surface and is thermally connected to the embedded metal.

20. The nitride semiconductor device according to claim 4, comprising: a lead-out metal that is formed on the second main surface and is thermally connected to the embedded metal.

* * * * *